(12) United States Patent
Lassalle-Balier

(10) Patent No.: US 11,408,948 B2
(45) Date of Patent: Aug. 9, 2022

(54) LINEAR BRIDGE HAVING NONLINEAR ELEMENTS FOR OPERATION IN HIGH MAGNETIC FIELD INTENSITIES

(71) Applicant: Allegro MicroSystems, LLC, Manchester, NH (US)

(72) Inventor: Rémy Lassalle-Balier, Bures sur Yvette (FR)

(73) Assignee: Allegro MicroSystems, LLC, Manchester, NH (US)

( * ) Notice: Subject to any disclaimer, the term of this patent is extended or adjusted under 35 U.S.C. 154(b) by 283 days.

(21) Appl. No.: 16/921,191

(22) Filed: Jul. 6, 2020

(65) Prior Publication Data

US 2021/0293907 A1 Sep. 23, 2021

Related U.S. Application Data

(63) Continuation-in-part of application No. 16/822,488, filed on Mar. 18, 2020.

(51) Int. Cl.
| | | |
|---|---|---|
| *G01R 33/09* | (2006.01) | |
| *G02B 7/04* | (2021.01) | |
| *G01R 33/00* | (2006.01) | |

(52) U.S. Cl.
CPC ....... *G01R 33/091* (2013.01); *G01R 33/0023* (2013.01); *G01R 33/093* (2013.01); *G01R 33/098* (2013.01); *G02B 7/04* (2013.01)

(58) Field of Classification Search
CPC .............. G01R 33/091; G01R 33/0023; G01R 33/093; G01R 33/098; G01R 33/0005; G02B 7/04
See application file for complete search history.

(56) References Cited

U.S. PATENT DOCUMENTS

| | | |
|---|---|---|
| 7,936,144 B2 | 5/2011 | Vig et al. |
| 8,084,969 B2 | 12/2011 | David et al. |
| (Continued) | | |

FOREIGN PATENT DOCUMENTS

| | | |
|---|---|---|
| DE | 10 2016 104285 A1 | 9/2016 |
| DE | 10 2015 218 855 A1 | 3/2017 |
| (Continued) | | |

OTHER PUBLICATIONS

PCT International Preliminary Report dated Mar. 10, 2022 for International Application No. PCT/US2020/046883; 9 Pages.

(Continued)

*Primary Examiner* — Douglas W Owens
(74) *Attorney, Agent, or Firm* — Daly, Crowley, Mofford & Durkee, LLP

(57) ABSTRACT

In one aspect, a bridge includes a first magnetoresistance element having a first reference angle; a second magnetoresistance element in series with the first magnetoresistance element and having a second reference angle; a third magnetoresistance element in parallel with the first magnetoresistance element and having the first reference angle; and a fourth magnetoresistance element in series with the third magnetoresistance element and having the second reference angle. An output of the bridge has a linear response over a range of horizontal magnetic field values having non-zero values and the range of horizontal magnetic field intensity values are associated with vertical magnetic field intensity values having zero Oersted (Oe) values. A reference angle indicates an angle the magnetoresistance element is most sensitive to changes in a magnetic field.

20 Claims, 21 Drawing Sheets

(56) References Cited

U.S. PATENT DOCUMENTS

| | | | |
|---|---|---|---|
| 8,138,708 | B2 | 3/2012 | Ward et al. |
| 8,461,782 | B2 | 6/2013 | Ward et al. |
| 8,629,642 | B2 | 1/2014 | Ward et al. |
| 8,716,959 | B2 | 5/2014 | David et al. |
| 8,736,316 | B2 | 5/2014 | Chaware et al. |
| 8,873,944 | B2 | 10/2014 | Latham et al. |
| 9,042,716 | B2 | 5/2015 | Cadugan et al. |
| 9,322,887 | B1 | 4/2016 | Eagen et al. |
| 9,354,284 | B2 | 5/2016 | Latham |
| 9,470,765 | B1 | 10/2016 | Latham |
| 9,529,060 | B2 | 12/2016 | Fermon et al. |
| 9,605,975 | B2 | 3/2017 | Foletto et al. |
| 9,605,979 | B2 | 3/2017 | Eagen et al. |
| 9,625,535 | B2 | 4/2017 | Cadugan et al. |
| 9,719,806 | B2 | 8/2017 | Foletto et al. |
| 9,720,054 | B2 | 8/2017 | Drouin et al. |
| 9,784,594 | B2 | 10/2017 | David et al. |
| 9,804,234 | B2 | 10/2017 | Dressier et al. |
| 9,812,637 | B2 | 11/2017 | Fermon et al. |
| 9,823,090 | B2 | 11/2017 | Foletto et al. |
| 9,823,092 | B2 | 11/2017 | David et al. |
| 9,880,026 | B1 | 1/2018 | Eagen et al. |
| 9,910,087 | B2 | 3/2018 | Eagen et al. |
| 9,922,673 | B2 | 3/2018 | Campiglio et al. |
| 10,036,785 | B2 | 7/2018 | David et al. |
| 10,041,810 | B2 | 8/2018 | Vig et al. |
| 10,114,085 | B2 | 10/2018 | Eagen et al. |
| 10,145,841 | B2 | 12/2018 | Foletto et al. |
| 10,290,608 | B2 | 5/2019 | Latham et al. |
| 10,310,028 | B2 | 6/2019 | Latham et al. |
| 10,330,745 | B2 | 6/2019 | Eagen et al. |
| 10,347,277 | B2 | 7/2019 | Campiglio et al. |
| 10,509,058 | B2 | 12/2019 | Cadugan et al. |
| 10,557,725 | B2 | 2/2020 | Paul et al. |
| 10,557,726 | B2 | 2/2020 | Lassalle-Balier |
| 10,557,873 | B2 | 2/2020 | Latham |
| 10,585,152 | B2 | 3/2020 | David et al. |
| 11,175,359 | B2 * | 11/2021 | Lassalle-Balier .... G01R 33/093 |
| 2002/0191451 | A1 | 12/2002 | Kishi et al. |
| 2005/0128654 | A1 | 6/2005 | Sapozhnikov |
| 2006/0267581 | A1 | 11/2006 | Wiese |
| 2009/0189601 | A1 | 7/2009 | Okada et al. |
| 2010/0073827 | A1 | 3/2010 | Zhao et al. |
| 2010/0271013 | A1 | 10/2010 | Servel et al. |
| 2010/0301845 | A1 | 12/2010 | Acker |
| 2011/0037459 | A1 | 2/2011 | Okada et al. |
| 2011/0285395 | A1 | 11/2011 | van Veldhoven et al. |
| 2012/0038348 | A1 | 2/2012 | Aimuta et al. |
| 2012/0095712 | A1 | 4/2012 | Komasaki et al. |
| 2012/0119729 | A1 | 5/2012 | Komasaki et al. |
| 2013/0113478 | A1 | 5/2013 | Pant |
| 2013/0335070 | A1 | 12/2013 | Abe et al. |
| 2014/0028307 | A1 | 1/2014 | Ausserlechner |
| 2014/0225605 | A1 | 8/2014 | Lei et al. |
| 2015/0192432 | A1 | 7/2015 | Noguchi et al. |
| 2016/0169707 | A1 | 6/2016 | Hirota et al. |
| 2016/0313412 | A1 | 10/2016 | Li et al. |
| 2017/0322052 | A1 | 11/2017 | Paul et al. |
| 2018/0224300 | A1 | 8/2018 | Vig et al. |
| 2018/0335484 | A1 | 11/2018 | Campiglio et al. |
| 2018/0335486 | A1 | 11/2018 | Lassalle-Balier et al. |
| 2019/0219643 | A1 | 7/2019 | Cadugan et al. |
| 2019/0234764 | A1 | 8/2019 | Lassalle-Balier |
| 2019/0383646 | A1 | 12/2019 | Lassalle-Balier et al. |
| 2020/0018780 | A1 | 1/2020 | Cadugan et al. |
| 2020/0033424 | A1 | 1/2020 | Campiglio et al. |
| 2020/0041310 | A1 | 2/2020 | Lassalle-Balier et al. |
| 2020/0041583 | A1 | 2/2020 | Cadugan et al. |
| 2020/0041584 | A1 | 2/2020 | Lassalle-Balier et al. |
| 2020/0064413 | A1 | 2/2020 | Campiglio et al. |
| 2020/0066790 | A1 | 2/2020 | Lassalle-Balier et al. |
| 2020/0379064 | A1 | 12/2020 | Yuan |
| 2022/0043082 | A1 | 2/2022 | Lassalle-Balier et al. |

FOREIGN PATENT DOCUMENTS

| | | |
|---|---|---|
| DE | 10 2018 113821 A1 | 12/2018 |
| EP | 2 674 728 A2 | 12/2013 |
| JP | 2011-158488 W | 8/2011 |
| JP | 2014-071039 A | 4/2014 |
| WO | WO 2019/152112 A1 | 8/2019 |
| WO | WO 2021/040797 A1 | 3/2021 |

OTHER PUBLICATIONS

PCT International Search Report and Written Opinion dated Oct. 23, 2020 for International Application No. PCT/US2020/046883; 15 Pages.

U.S. Non-Final Office Action dated Apr. 22, 2021 for U.S. Appl. No. 16/553,641; 15 Pages.

U.S. Appl. No. 16/139,742, filed Sep. 24, 2018, Romero.

U.S. Appl. No. 16/145,841, filed Sep. 28, 2018, Foletto et al.

U.S. Appl. No. 16/157,313, filed Oct. 11, 2018, Lassalle-Balier et al.

U.S. Appl. No. 16/157,317, filed Oct. 11, 2018, Lassalle-Balier et al.

U.S. Appl. No. 16/232,348, filed Dec. 26, 2018, Eagen et al.

U.S. Appl. No. 16/244,452, filed Jan. 10, 2019, Lassalle-Balier et al.

U.S. Appl. No. 16/280,199, filed Feb. 20, 2019, Liu et al.

U.S. Appl. No. 16/397,162, filed Apr. 29, 2019, Kulla et al.

U.S. Appl. No. 16/398,522, filed Apr. 30, 2019, Cesaretti et al.

U.S. Appl. No. 16/420,470, filed May 23, 2019, Tran et al.

U.S. Appl. No. 16/507,544, filed Jul. 10, 2019, David et al.

U.S. Appl. No. 16/507,552, filed Jul. 10, 2019, Lassalle-Balier et al.

U.S. Appl. No. 16/507,560, filed Jul. 10, 2019, Lassalle-Balier et al.

U.S. Appl. No. 16/522,810, filed Jul. 26, 2019, David et al.

U.S. Appl. No. 16/533,030, filed Aug. 6, 2019, Romero et al.

U.S. Appl. No. 16/553,633, filed Aug. 28, 2019, Lassalle-Balier et al.

U.S. Appl. No. 16/683,800, filed Nov. 14, 2019, David et al.

U.S. Appl. No. 16/749,074, filed Jan. 22, 2020, Romero.

U.S. Appl. No. 16/800,229, filed Feb. 25, 2020, Lassalle-Balier et al.

U.S. Appl. No. 16/822,488, filed Mar. 18, 2020, Lassalle-Balier et al.

PCT International Search Report and Written Opinion dated Mar. 14, 2019 for International Application No. PCT/US2018/066995; 13 Pages.

Jaffrés et al., "Angular Dependence of the Tunnel Magnetoresistance in Transition-Metal-Based Junctions;" Physical Review B, vol. 64, 064427; Jul. 2001; 7 Pages.

PCT International Search Report and Written Opinion dated Sep. 6, 2021 for International Application No. PCT/US2021/034432; 15 Pages.

* cited by examiner

|  | MR elements 1804a 1804b | MR elements 1806a 1806b | MR elements 1808a 1808b |
|---|---|---|---|
| Pillar Count | 17.5 | 6 | 12.5 |
| Reference Angle (°) | -112.75 | 175 | -8 |

LINEAR BRIDGE HAVING NONLINEAR ELEMENTS FOR OPERATION IN HIGH MAGNETIC FIELD INTENSITIES

CROSS REFERENCE TO RELATED APPLICATIONS

This is a Continuation-in-Part (CIP) application of and claims the benefit of and priority to U.S. patent application Ser. No. 16/822,488, filed Mar. 18, 2020, entitled "LINEAR BRIDGES HAVING NONLINEAR ELEMENTS," which is incorporated herein by reference in its entirety.

BACKGROUND

The term "magnetic-field sensing element" is used to describe a variety of electronic elements that can sense a magnetic field. The magnetic-field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic-field sensing elements tend to have an axis of maximum sensitivity parallel to a substrate that supports the magnetic-field sensing element, and others of the above-described magnetic-field sensing elements tend to have an axis of maximum sensitivity perpendicular to a substrate that supports the magnetic-field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

SUMMARY

In one aspect, a bridge includes a first magnetoresistance element having a first reference angle; a second magnetoresistance element in series with the first magnetoresistance element and having a second reference angle; a third magnetoresistance element in parallel with the first magnetoresistance element and having the first reference angle; and a fourth magnetoresistance element in series with the third magnetoresistance element and having the second reference angle. An output of the bridge has a linear response over a range of horizontal magnetic field values having non-zero values and the range of horizontal magnetic field intensity values are associated with vertical magnetic field intensity values having zero Oersted (Oe) values. A reference angle indicates an angle the magnetoresistance element is most sensitive to changes in a magnetic field.

In another aspect, a camera, includes a magnetic field sensor that includes a bridge. The bridge includes a first magnetoresistance element having a first reference angle; a second magnetoresistance element in series with the first magnetoresistance element and having a second reference angle; a third magnetoresistance element in parallel with the first magnetoresistance element and having the first reference angle; and a fourth magnetoresistance element in series with the third magnetoresistance element and having the second reference angle. An output of the bridge has a linear response over a range of horizontal magnetic field intensity values having non-zero values and the range of horizontal magnetic field intensity values are associated with vertical magnetic field intensity values having zero Oersted (Oe) values. A reference angle indicates an angle the magnetoresistance element is most sensitive to changes in a magnetic field.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate bridges for linear magnetometers (linear bridges) using nonlinear magnetoresistance elements, such as, for example, giant magnetoresistance (GMR) elements or tunneling magnetoresistance (TMR) elements. In some examples, the techniques described herein may be used to construct linear magnetometers that are linear in magnetic field trajectories and ranges where magnetoresistance elements are typically not linear.

Figure 1:
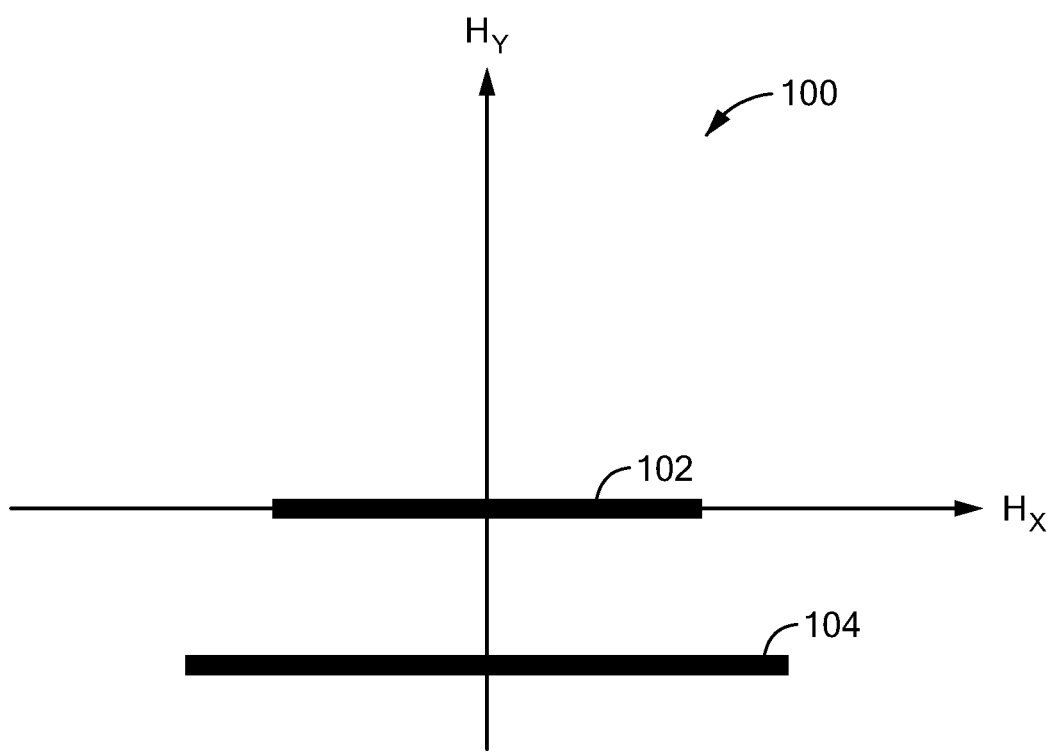
FIG. 1 is a graph of an example of magnetic field trajectories for a linear magnetic field sensor.

Referring to FIG. 1, a linear trajectory is a straight line in Hx and Hy space where Hx represents a horizontal magnetic field intensity and Hy represents a vertical magnetic field intensity. A graph 100 includes examples of linear trajectories from linear magnetic field sensors that are centered about Hx=0 Oersted (Oe). In one example, a linear trajectory 102 is centered about Hx=0 Oe and has a Hy=0 Oe. In another example, a linear trajectory 104 is centered about Hx=0 Oe and has a Hy=a fixed nonzero value.

As will be further described herein, TMR elements and GMR elements may be used to construct bridges that have a linear response. For example, using the techniques described herein, an output of a bridge that includes TMR elements or GMR elements has a linear response with respect to the horizontal magnetic field.

Figure 2:
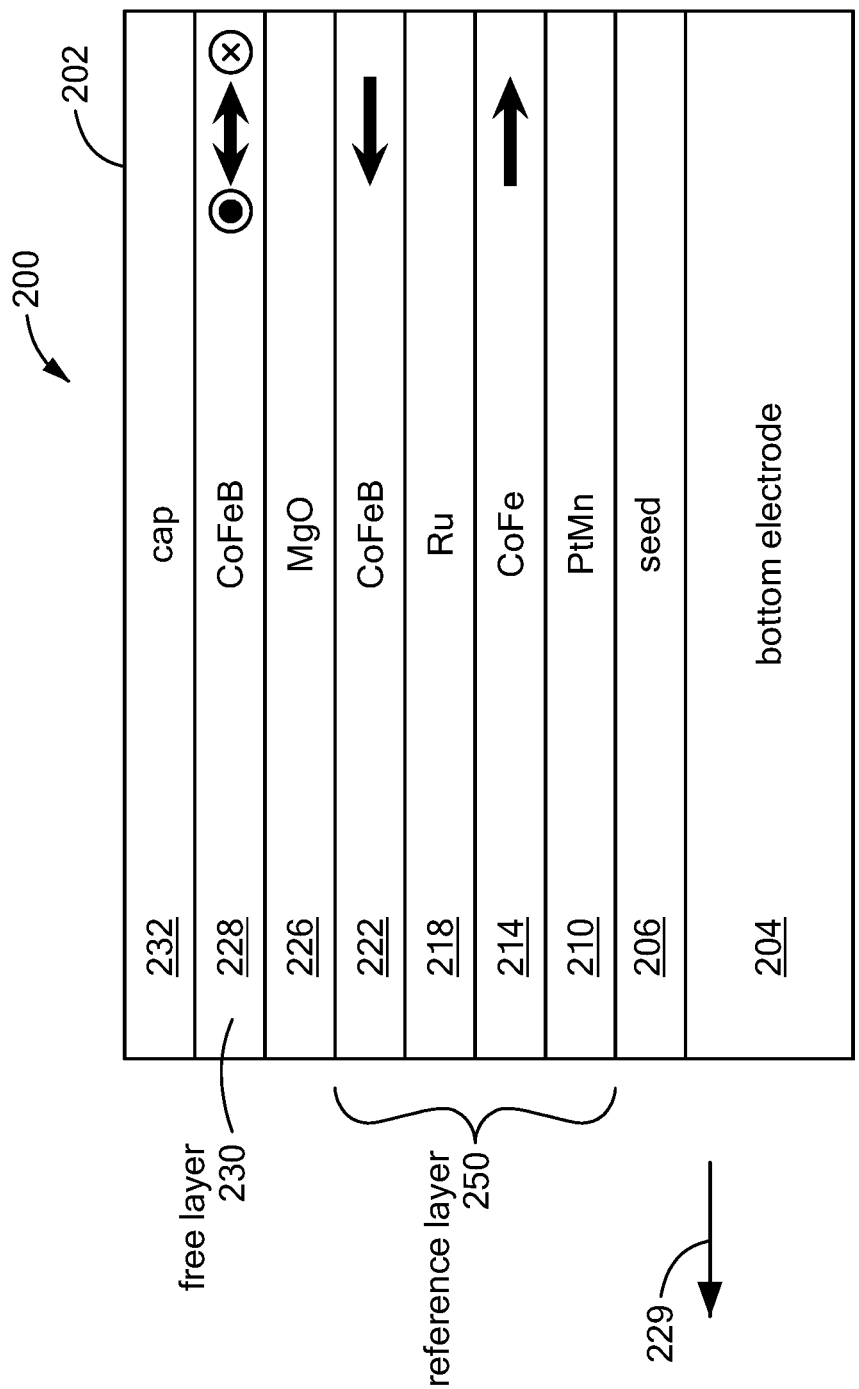
FIG. 2 is a block diagram of a prior art example of a tunneling magnetoresistance (TMR) element.

Referring to FIG. 2, an illustrative TMR element 200 can have a stack 202 of layers 206, 210, 214, 218, 222, 226, 228, 232, indicative of one pillar of a multi-pillar TMR element. Generally, the layer 206 is a seed layer (e.g., a copper nickel (CuN) layer) with the layer 210 located on the seed layer 206. The layer 210 includes platinum manganese (PtMn) or iridium manganese (IrMn), for example. The layer 214 is located on the layer 210 and the layer 218 is located on the layer 214. In one example, the layer 214 includes cobalt iron (CoFe) and the layer 218 is a spacer layer and includes ruthenium (Ru). On the layer 218, a magnesium oxide (MgO) layer 226 is sandwiched between two cobalt iron boron (CoFeB) layers 222, 228. A cap layer 232 (e.g., tantalum (Ta)) is located on the CoFeB layer 228. The layer 214 is a single layer pinned layer that is magnetically coupled to the layer 210. The physical mechanism that is coupling layers 210 and 214 together is sometimes called an exchange bias.

A free layer 230 includes the CoFeB layer 228. In some examples, the free layer 230 may include an additional layer of nickel iron (NiFe) (not shown) and a thin layer of tantalum (not shown) between the CoFeB layer 228 and the NiFe layer.

It will be understood that a driving current running through the TMR element 200 runs through the layers of the stack, running between seed and cap layers 206 and 232, i.e., perpendicular to a surface of a bottom electrode 204. The TMR element 200 can have a maximum response axis that is parallel to the surface of the bottom electrode 204 and that is in a direction 229, and also parallel to the magnetization direction of the reference layer 250, comprised of layers 210, 214, 218, and 222, most notably in the layer CoFeB 222.

The TMR element 200 has a maximum response axis (maximum response to external fields) aligned with the arrow 229, and parallel to magnetic fields of the reference layer 250, notably pinned layer 222. Also, in general, it is rotations of the magnetic direction of the free layer 230 caused by external magnetic fields that result in changes of resistance of the TMR element 200, which may be due to a change in angle or a change in amplitude if an external bias is present because the sum vector of the external field and the bias is causing a change in the angle between the reference and free layers.

Figure 3:
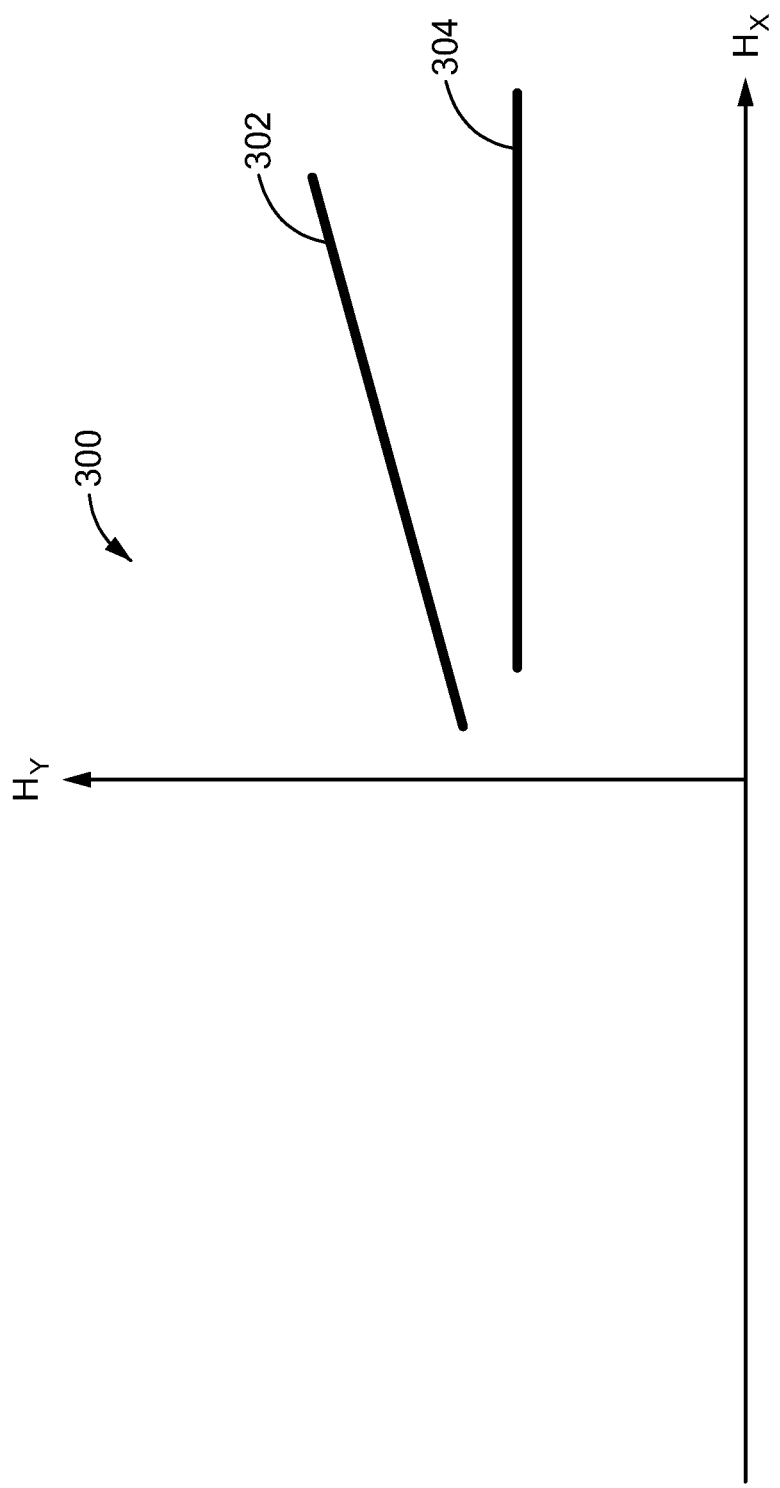
FIG. 3 is a graph of an example of magnetic field linear trajectories for a bridge that includes magnetoresistance (MR) elements.

Referring to FIG. 3, TMR elements and GMR elements may be used to construct bridges that have linear trajectories; however, these trajectories are not centered about the vertical axis (Hy) or not parallel to the sensor sensitive axis or neither of both. For example, a linear trajectory 302 and a linear trajectory 304 are not centered about the vertical axis (Hy axis). These linear trajectories may be used to construct bridges that have an output that has a linear response with respect to a horizontal magnetic field (Hx).

Figure 4:
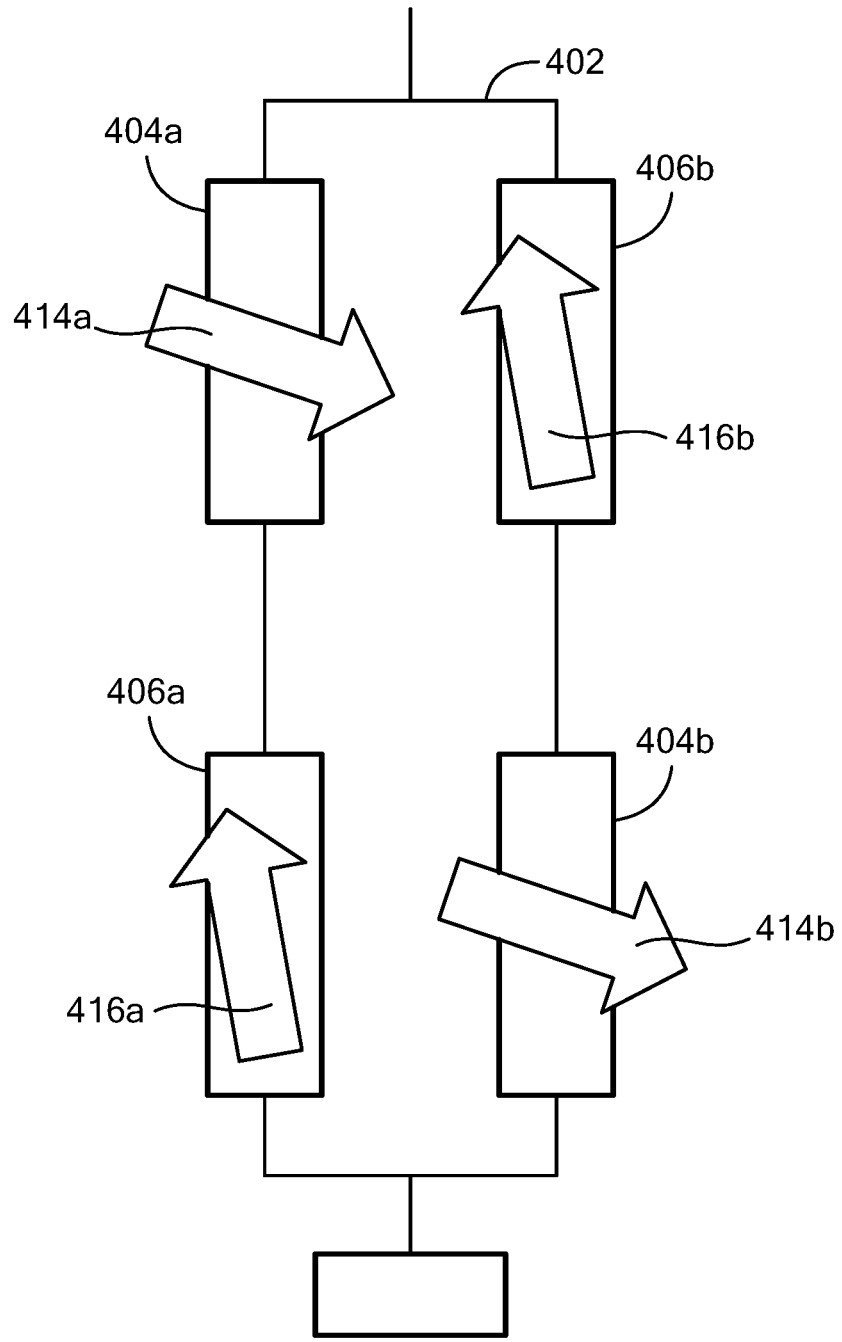
FIG. 4 is a circuit diagram of an example of the bridge that includes MR elements.

Referring to FIG. 4, an example of a linear bridge is a bridge 402. In one example, the bridge 402 is a current-driven bridge.

The bridge 402 includes a magnetoresistance (MR) element 404a, an MR element 404b, an MR element 406a and an MR element 406b. Each MR element 404a, 404b, 406a, 406b includes a reference direction. For example, the MR element 404a includes a reference direction 414a, the MR element 404b includes a reference direction 414b, the MR element 406a includes a reference direction 416a and the MR element 406b includes a reference direction 416b. As used herein, a reference direction (sometimes referred to herein as a reference angle) indicates the direction the MR element is most sensitive to an external magnetic field.

The MR element 404a and the MR element 404b are a first type of MR element that is the MR elements 404a, 404b are electrically the same and their reference angles 414a, 414b are equal. The first type of MR element has a resistance, $R_{type1}$.

The MR element 406a and the MR element 406b are a second type of MR element that is the MR elements 406a, 406b are electrically the same and their reference angles 416a, 416b are equal. The second type of MR element has a resistance, $R_{type2}$.

As will be further described herein, in order to achieve a bridge that has an output that has a linear response, the reference angle 414a, 414b and the reference angle 416a, 416b are determined. In the example, where the linear bridge 402 is a current driven bridge, the output voltage of the bridge is equal to Icc*($R_{type1}$-$R_{type2}$), where Icc is the current that supplies the bridge 402.

In one example, with the reference angle 414a, 414b and the reference angle 416a, 416b determined, the MR elements 404a, 404b provide most of the signal from the linear bridge 402 by setting a reference direction the MR elements 406a, 406b of the second type may offset the nonlinearity of the MR elements 404a, 404b of the second type.

Figure 5:
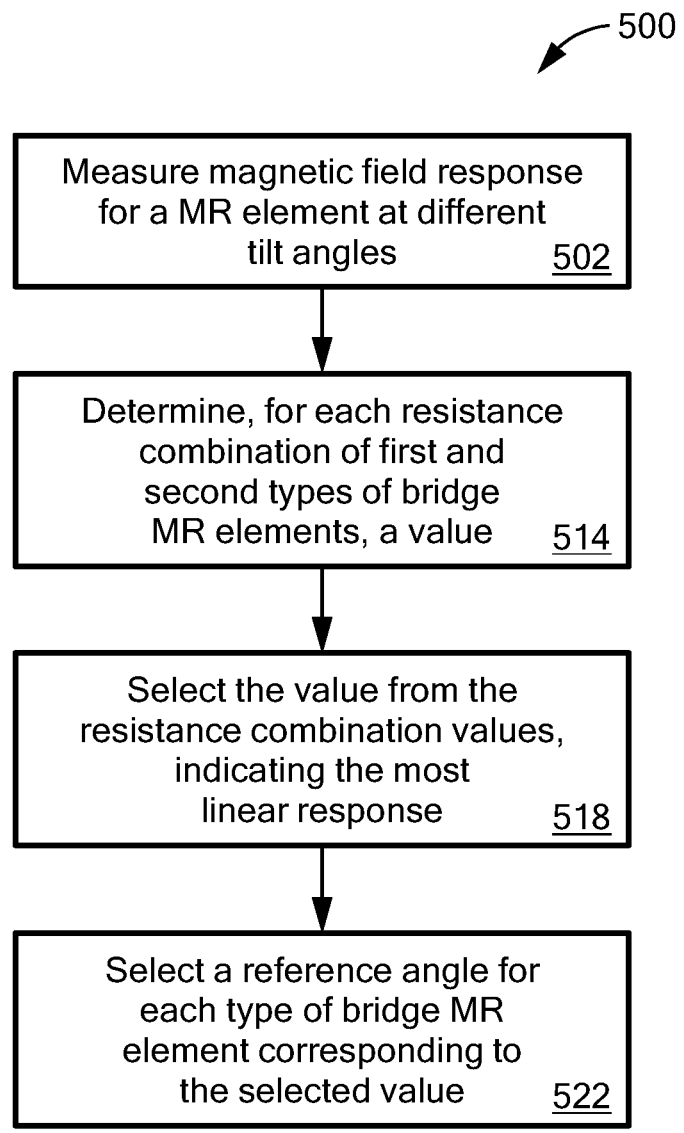
FIG. 5 is a flow diagram of an example of a process to determine reference angles for the MR elements.

Referring to FIG. 5, an example of a process to determine reference angles is a process 500. Process 500 measures a magnetic field response for a MR element at different tilting angles (502).

Process 500 determines, for each resistance combination of first and second types of bridge MR elements, a value (514). For example, a resistance combination is a resistance of the first type of MR element less a resistance of the second type of MR element (e.g., a resistance of the MR element 404a less a resistance of the MR element 406a (see FIG. 4) or ($R_{type1}$-$R_{type2}$). Each resistance combination has a value. In one example, the value is a linear value having a value between zero and a hundred where zero is the most linear value and 100 is the least linear value.

Process 500 selects a value from the resistance combination values indicating the most linear response (518). For example, a linear value closest to zero is selected.

Process 500 selects a reference angle for each type of bridge MR element corresponding to the selected value (522). For example, the selected value from processing block 518 is associated resistance combination which is associated with a reference angle 414a, 414b for the first type of MR elements 404a, 404b and a reference angle 416a, 416b for the second type of MR elements 406a, 406b.

Figure 6A:
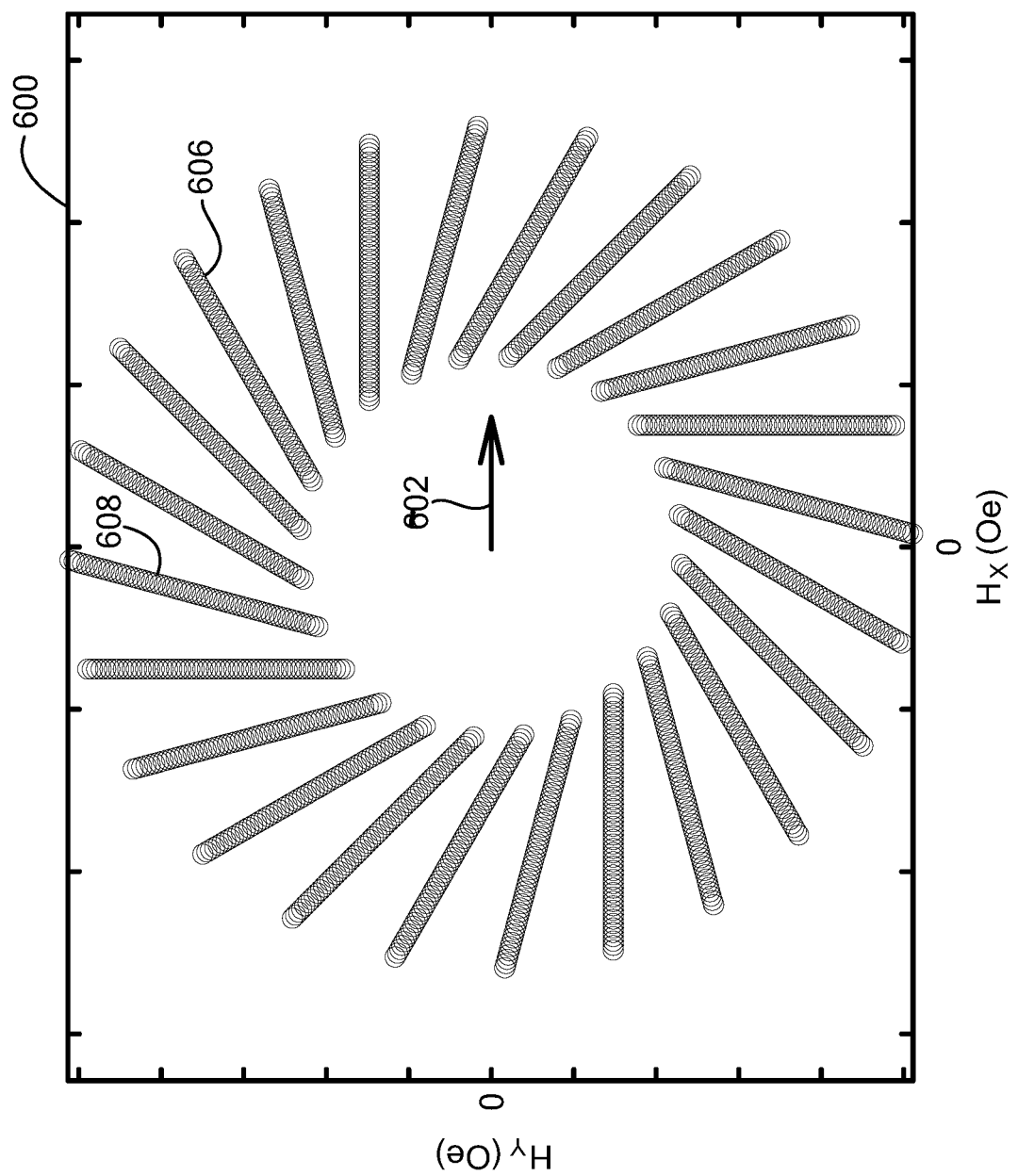
FIG. 6A is a graph of an example of magnetic field trajectories.

Referring to FIG. 6A, a graph 600 depicts various examples of tilted and repeated magnetic field trajectories for an MR element. Each different tiled angle is associate with a difference reference angle. For example, a tilted magnetic field trajectory is a magnetic field trajectory 606 associated with a first reference angle. In another example, a tilted magnetic field trajectory is a magnetic field trajectory 608 associated with a second reference angle. An example of the pinning direction of the MR element is a pinning direction 602 (similar to the pinning direction on layer 222 (FIG. 2)).

Figure 6B:
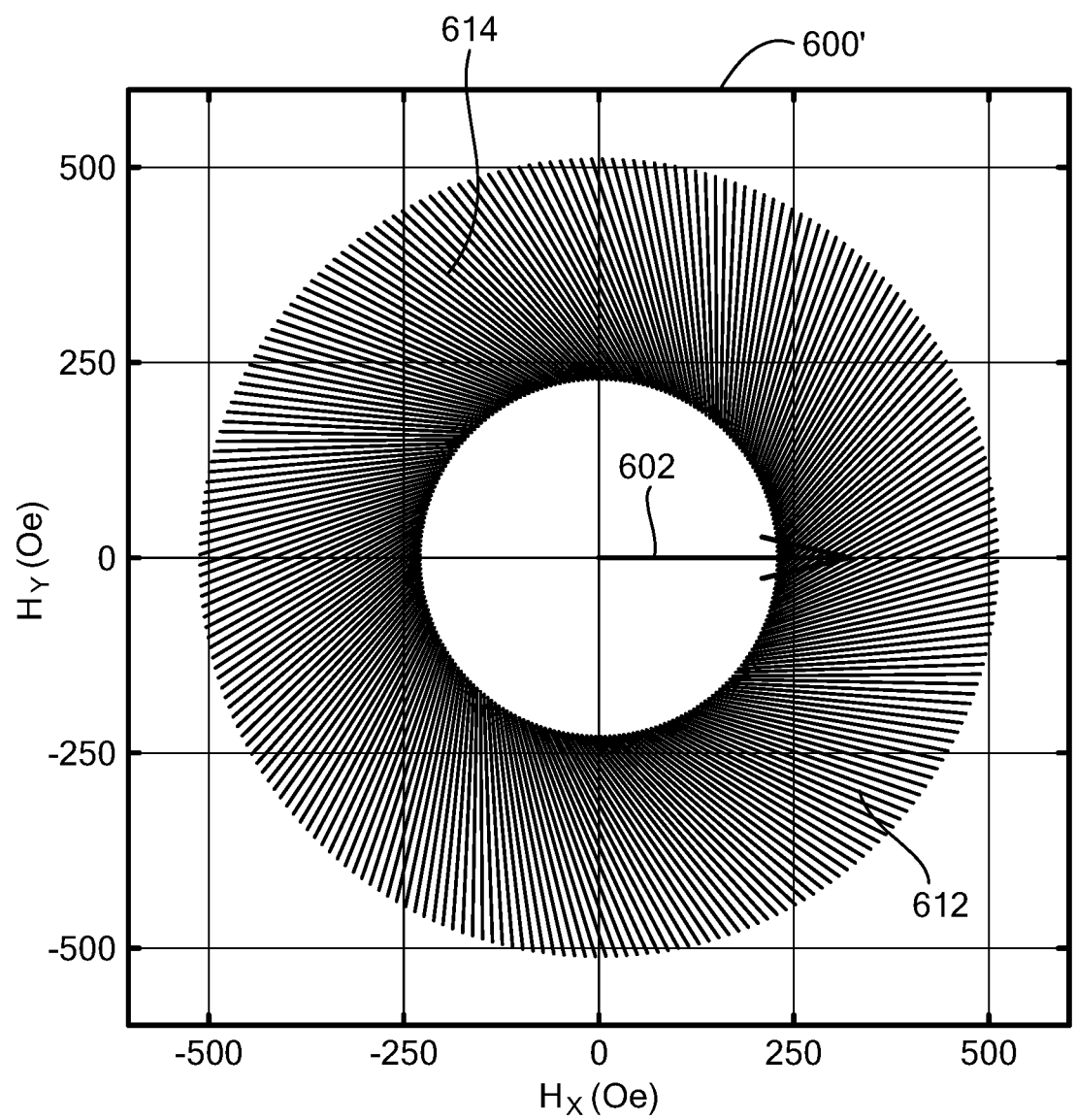
FIG. 6B is a graph of another example of magnetic field trajectories.

Referring to FIG. 6B, another example of the graph 600 is a graph 600'. The graph 600' depicts more than 200 tilted magnetic field trajectories. In the graph 600', a 1.5° angle step is used, and a 2.5 Oe magnetic field step is used to produce the more than 200 tilted magnetic field trajectories. Each magnetic field trajectory represents a different reference angle. For example, a magnetic field trajectory 612 is associated with a reference angle of 135° and a magnetic field trajectory 614 is associated with a reference angle of 0°.

Figure 7:
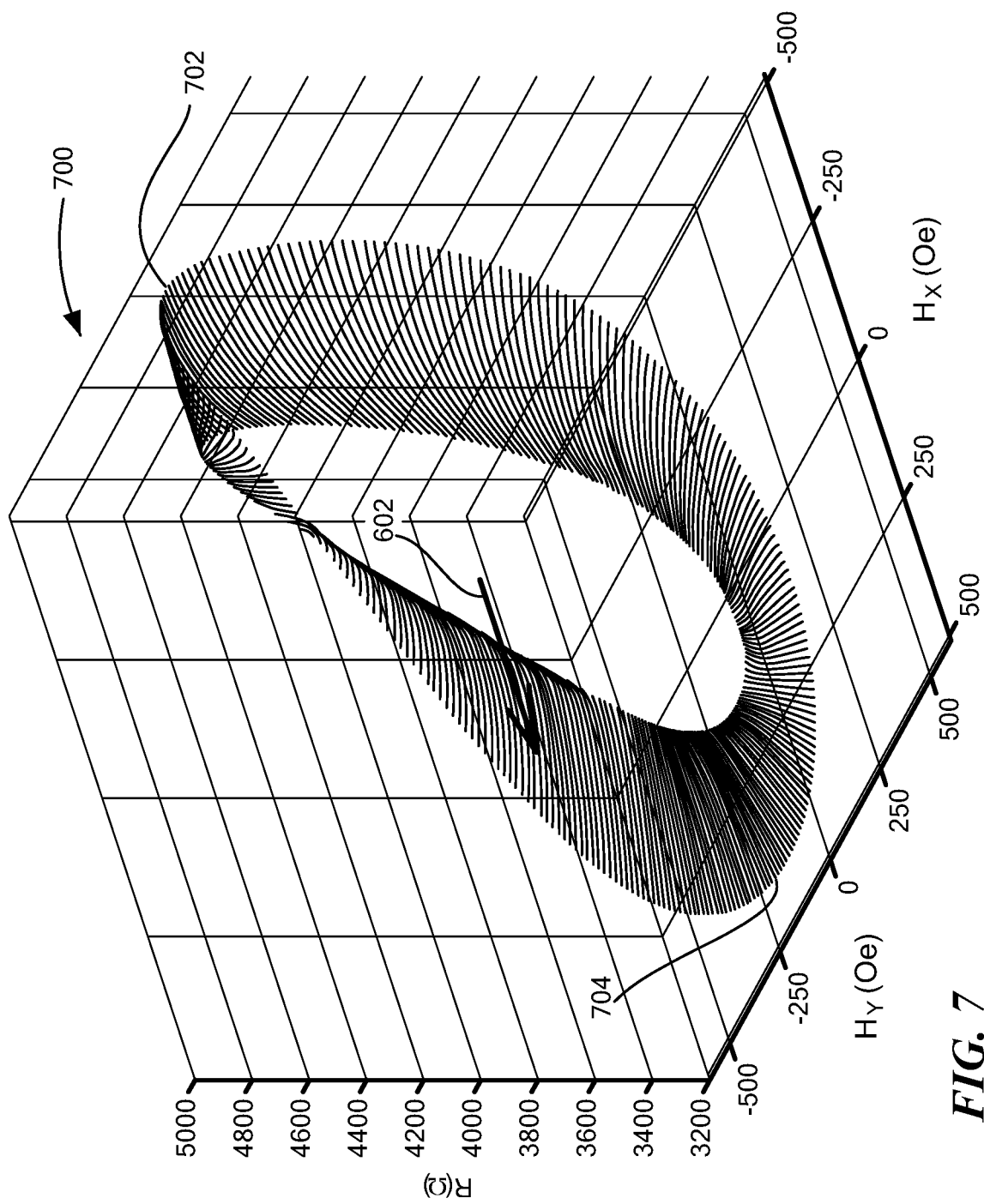
FIG. 7 is a graph of an example of resistance of an MR element with respect to magnetic field trajectories.

Referring to FIG. 7, a graph 700 depicts each line (e.g., a line 702, a line 704) represents the resistance of an MR element with reference 602 with respect to linear trajectory 612, for example.

Figure 8:
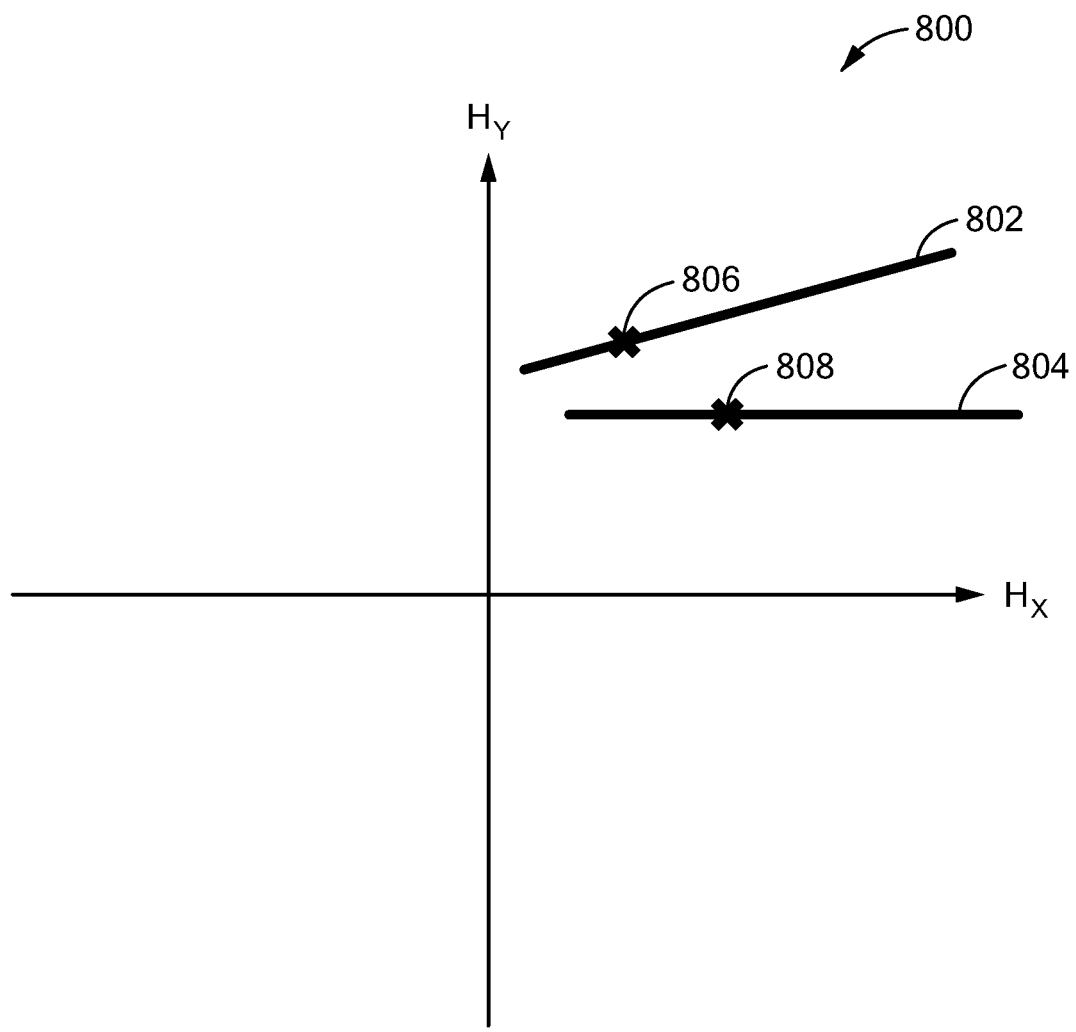
FIG. 8 is a graph of an example of magnetic field trajectories with zero offsets for a bridge that includes MR elements.

Referring to FIG. 8, a graph 800 is identical to graph 300 except the linear trajectories 802, 804 include locations 806, 808, respectively. The locations 806, 808 indicate where in the horizontal magnetic field (Hx) it is desired that the linear bridge produces a zero-voltage output.

Figure 9:
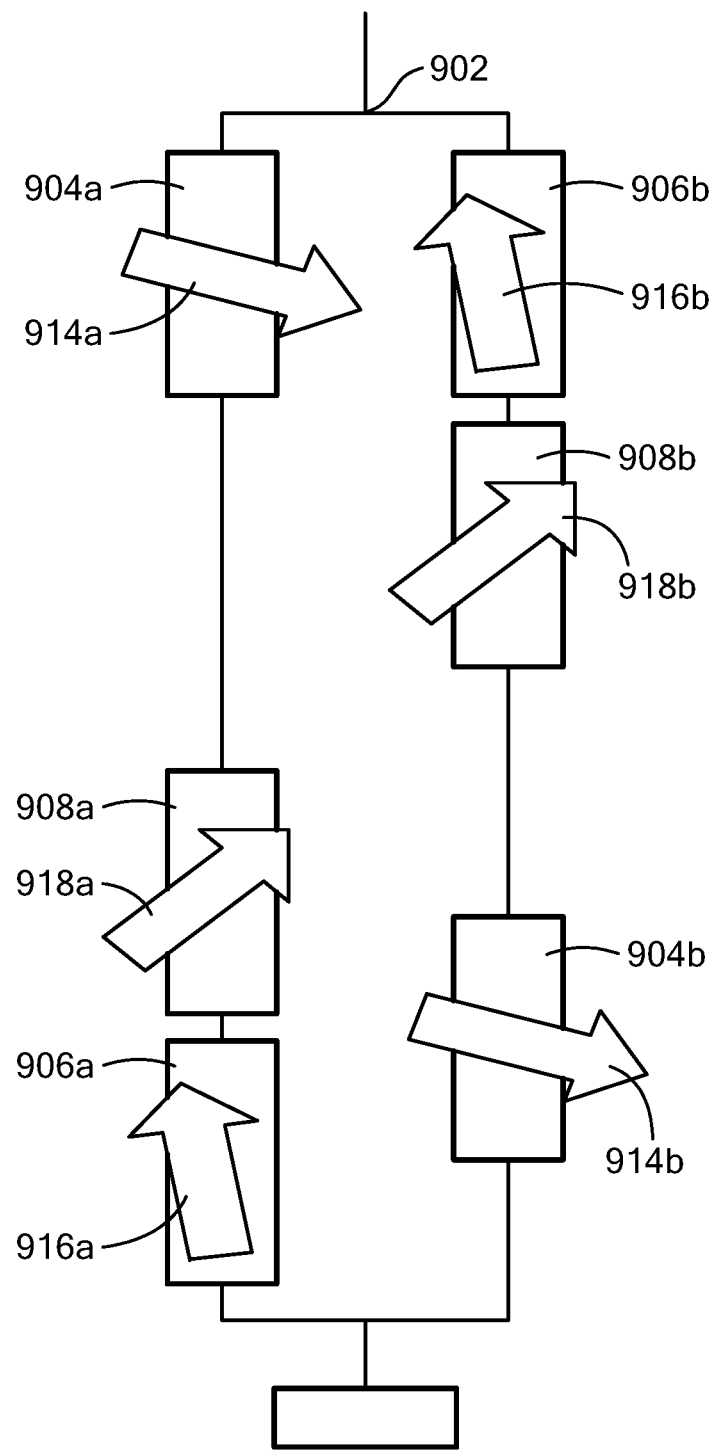
FIG. 9 is a circuit diagram of an example of the bridge that includes MR elements used to generate linear response having a zero voltage.

Referring to FIG. 9, an example of a linear bridge that has an output voltage that is linear but includes a point where the output voltage is zero is a bridge 902. The bridge 902 is similar to the bridge 402 but includes a third type of MR elements. Reference angles for the third type of MR elements are determined to enable that the horizontal magnetic field intensity (Hx) value at the location desired (e.g., either location 806 or the location 808) is a point where the bridge 902 has zero output.

The bridge 902 includes MR element 904a, an MR element 904b, an MR element 906a, an MR element 906b, an MR element 908a and an MR element 908b. Each MR element 904a, 904b, 906a, 906b, 908a, 908b includes a reference direction. For example, the MR element 904a includes a reference direction 914a, the MR element 904b includes a reference direction 914b, the MR element 906a includes a reference direction 916a, the MR element 906b includes a reference direction 916b, the MR element 908a includes a reference direction 918a and the MR element 908b includes a reference direction 918b.

The MR element 904a and the MR element 904b are the first type of MR element that is the MR elements 904a, 904b are electrically the same and their reference angles 914a, 914b are equal.

The MR element 906a and the MR element 906b are the second type of MR element that is the MR elements 906a, 906b are electrically the same and their reference angles 916a, 916b are equal.

The MR element 908a and the MR element 908b are the second type of MR element that is the MR elements 908a, 908b are electrically the same and their reference angles 918a, 918b are equal.

Figure 10:
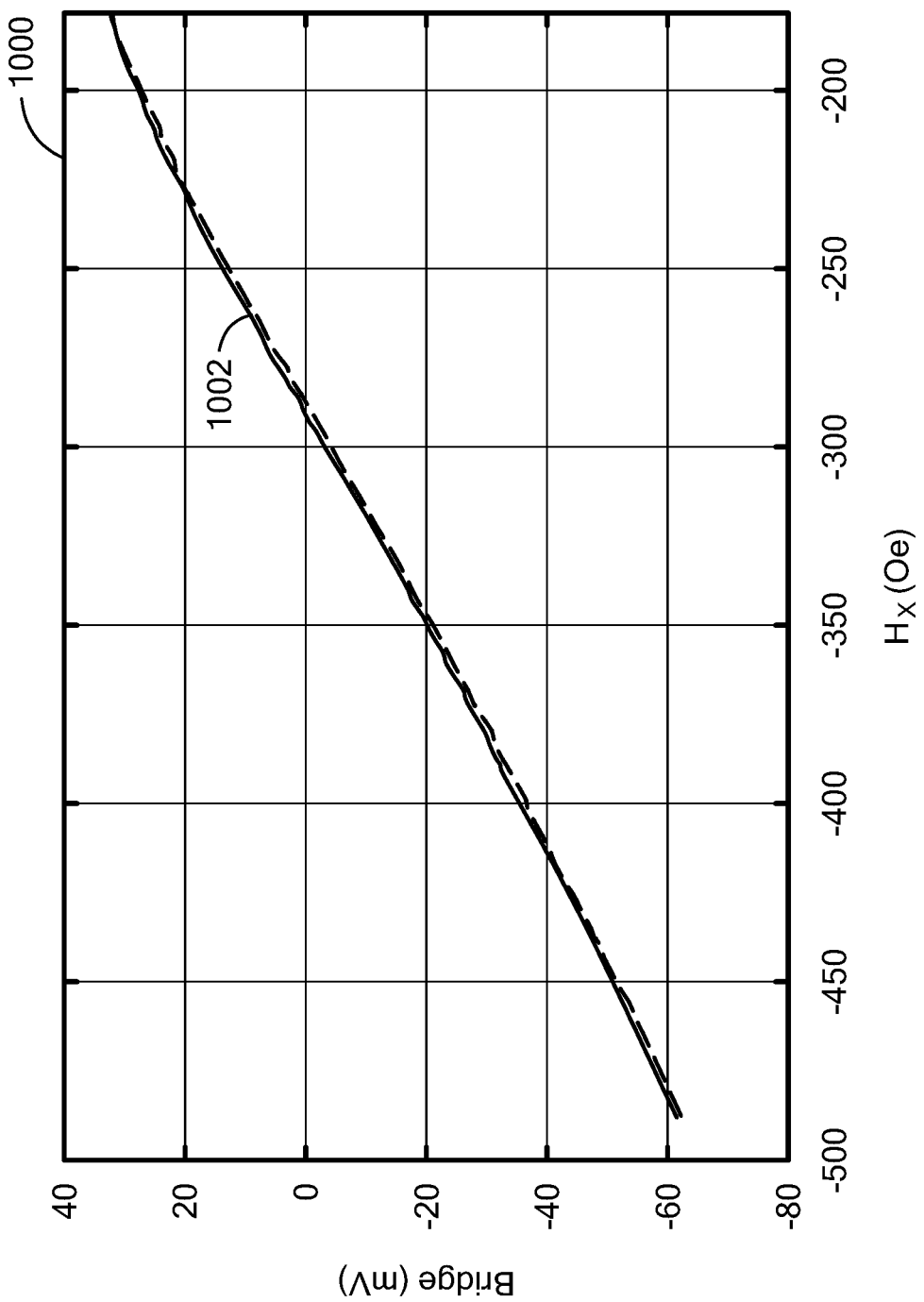
FIG. 10 is a graph of an example of an output of the bridge in FIG. 9.

Referring to FIG. 10, a graph 1000 includes a curve 1002 which is an example, of a voltage output of a bridge, such as for example, the bridge 902 (FIG. 9). The curve 1002 is substantially linear indicating that the bridge output has a linear response with respect to the horizontal magnetic field.

Figure 11:
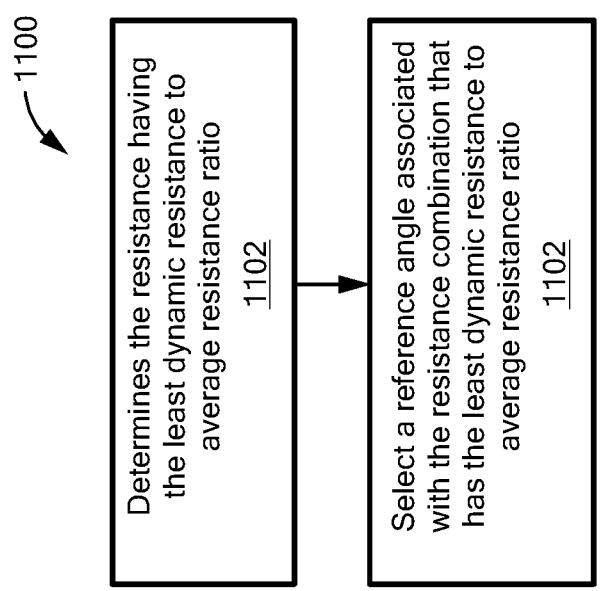
FIG. 11 is a flow diagram of an example of a process to a reference angle for a third type of MR elements in the bridge of FIG. 9.

Referring to FIG. 11, a process to determine the reference angle of the third type of MR elements is a process 1100. Process 1000 determines the resistance that has the least dynamic resistance to average resistance (over the application magnetic field trajectory) ratio (1102). For example, in the graph 700, the resistance that has the least dynamic resistance to average resistance ratio is determined, where the dynamic resistance varies with the applied magnetic field.

Process 1100 selects a reference angle associated with resistance combination that has the least dynamic resistance to average resistance (over the application magnetic field trajectory) ratio (1106). For example, in the graph 700 the reference angle associated with the resistance that has the least dynamic resistance to average resistance ratio is selected.

In other examples, instead of adding MR 908a, 908b elements, a combination of different MR elements with different reference directions may be added that would, once connected together in series or in parallel, produce a small dynamic resistance to average resistance ratio.

Figure 12:
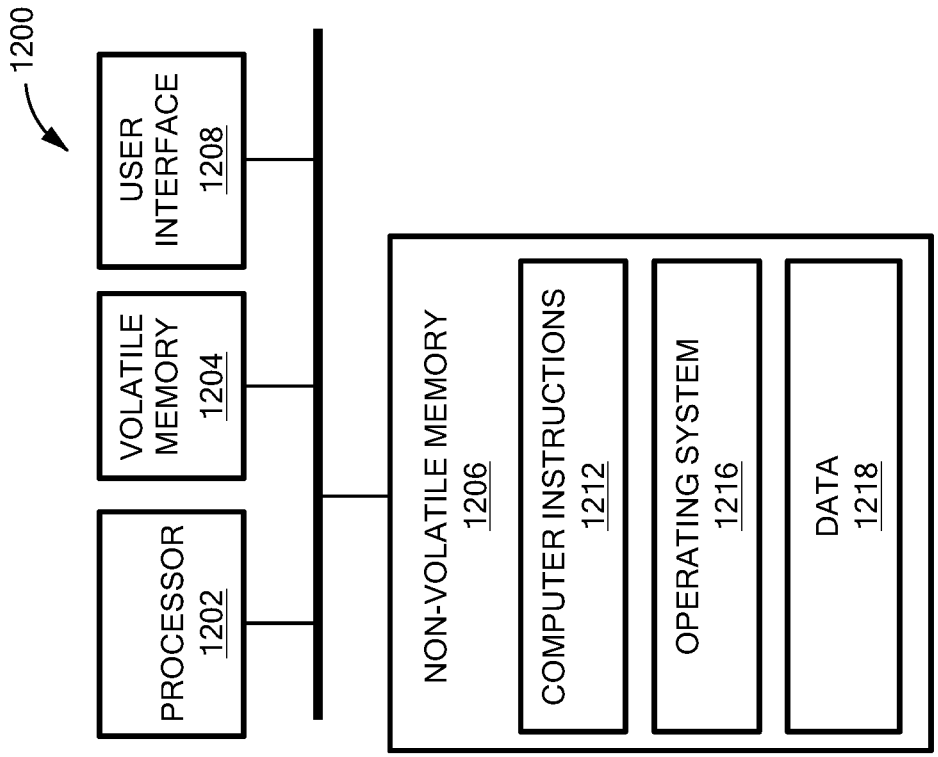
FIG. 12 is a block diagram of an example of a computer on which any of the process of FIG. 5 and/or FIG. 11 may be implemented.

Referring to FIG. 12, an example of a computer is a computer 1200 includes a processor 1202, a volatile memory 1204, a non-volatile memory 1206 (e.g., hard disk) and the user interface (UI) 1208 (e.g., a graphical user interface, a mouse, a keyboard, a display, touch screen and so forth). The non-volatile memory 1206 stores computer instructions 1212, an operating system 1216 and data 1218. In one example, the computer instructions 1212 are executed by the processor 1202 out of volatile memory 1204 to perform all or part of the processes described herein (e.g., processes 500 and 1100).

The processes described herein (e.g., processes 500 and 1100) are not limited to use with the hardware and software of FIG. 12; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium), for execution by, or to control the operation of, data processing apparatus (e.g., a programmable processor, a computer, or multiple computers)). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

The processes described herein are not limited to the specific examples described. For example, the processes 500 and 1100 are is not limited to the specific processing order of FIGS. 5 and 11, respectively. Rather, any of the processing blocks of FIGS. 5 and 11 may be re-ordered, combined or removed, performed in parallel or in serial, as necessary, to achieve the results set forth above.

The processing blocks (for example, the processes 500 and 1100) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, programmable logic devices or logic gates.

Figure 13:
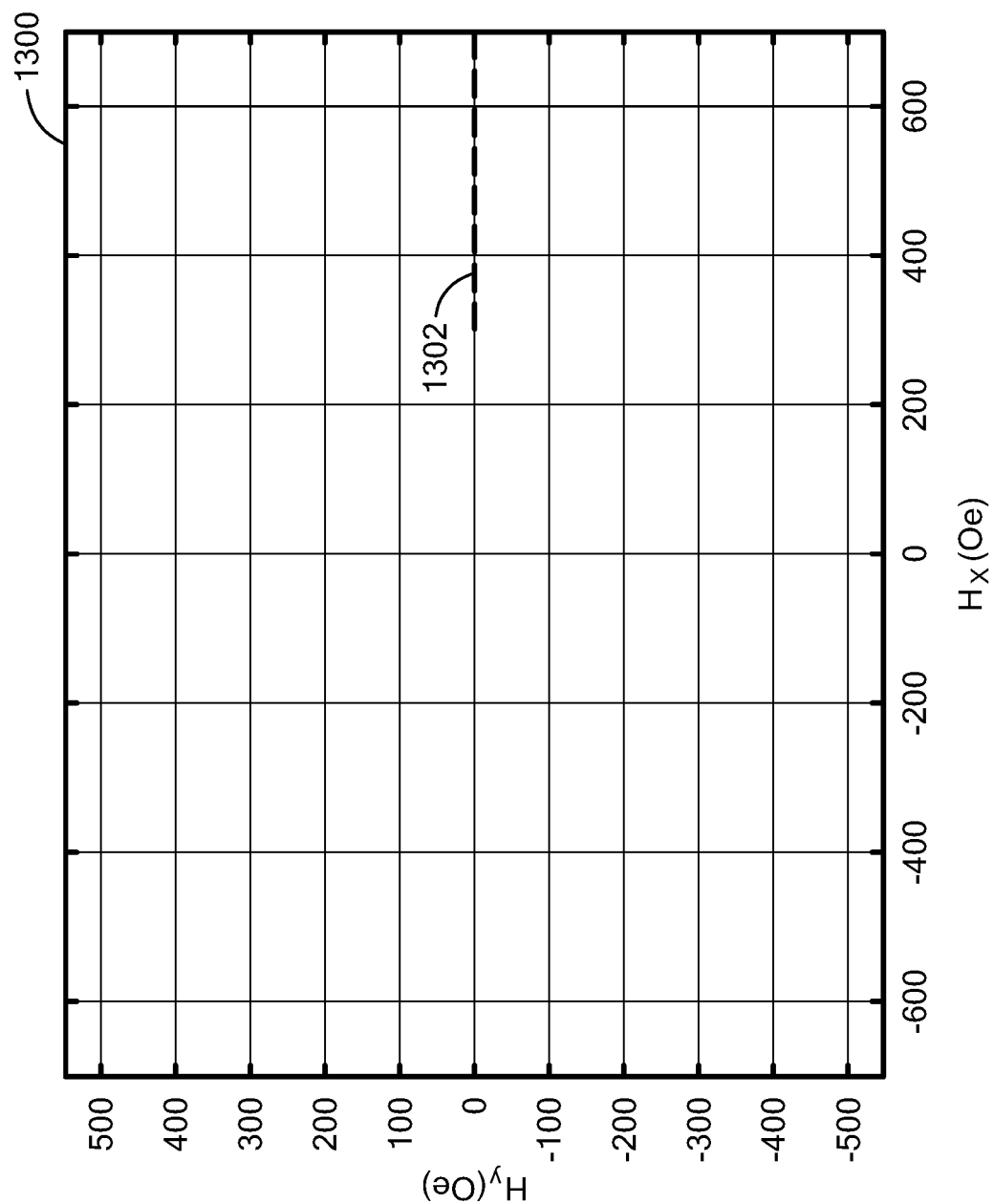
FIG. 13 is a graph of an example of a magnetic field trajectory without an external magnetic field bias.

Referring to FIG. 13, some applications require a linear bridge that is sensitive to a magnetic field intensity in the absence of an external magnetic field bias. For example, a graph 1300 depicts a magnetic field trajectory 1302 for which it is desired that a linear bridge be able to detect. In this example, the magnetic field trajectory 1302 has nonzero horizontal magnetic field intensity values and zero vertical magnetic field intensity values. In particular, the nonzero horizontal magnetic field intensity values of the magnetic field trajectory 1302 are greater than 200 Oe.

Figure 14:
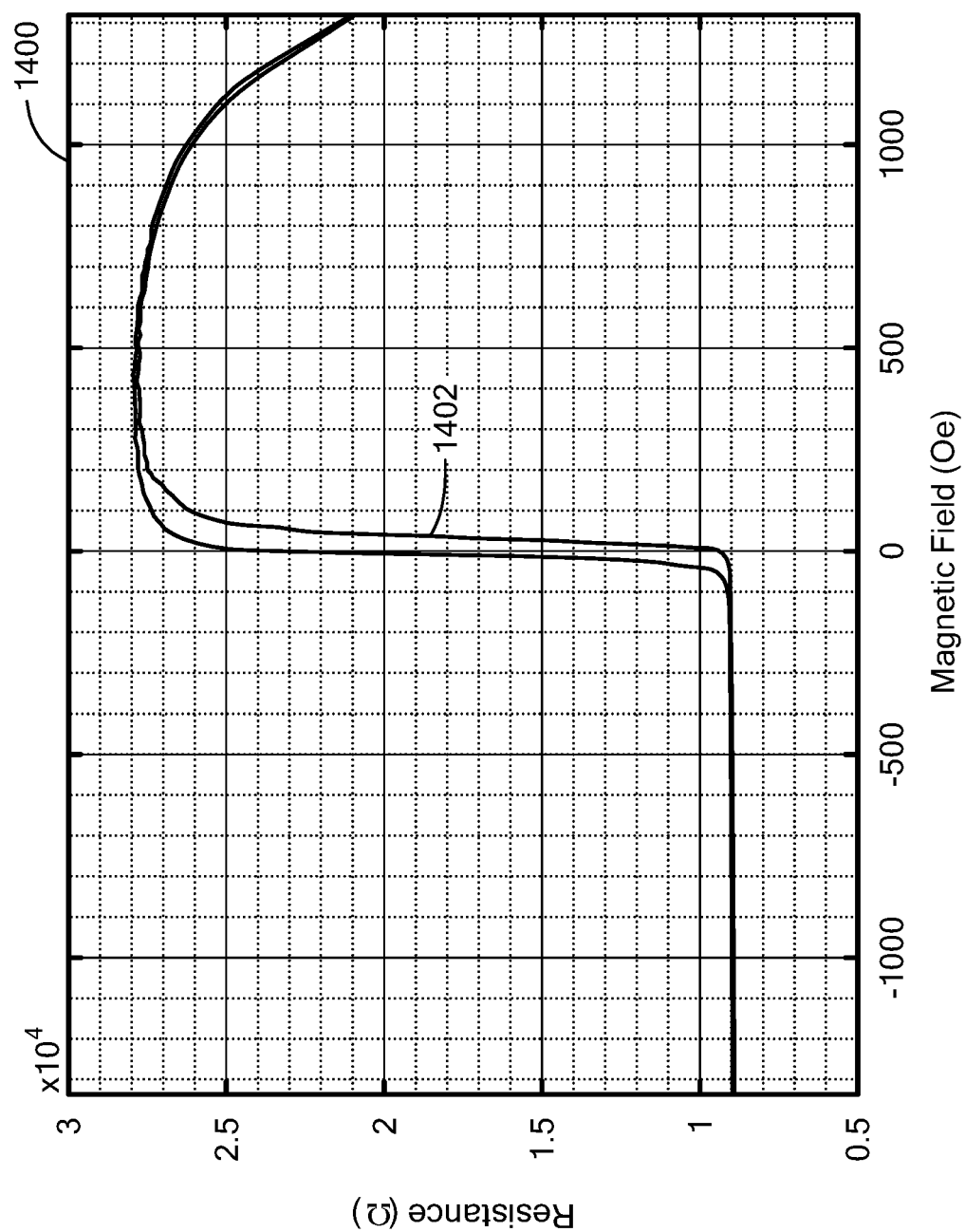
FIG. 14 is a graph of an example of a response of a tunneling magnetoresistance (TMR) element when a reference direction is aligned along the $H_x$-axis as depicted in FIG. 13.

Referring to FIG. 14, typically, GMR and TMR elements do not function in high magnetic fields, because it exceeds their linear range and their saturation regions. For example, as shown in a graph 1400, a resistance curve 1402 of a TMR element drops for magnetic fields above 500 Oe for a TMR element that has a reference direction that is aligned along the horizontal magnetic field axis. The drop in resistance is caused by a spin flop, which is a breaking of the directionality of the reference layer.

Figure 15:
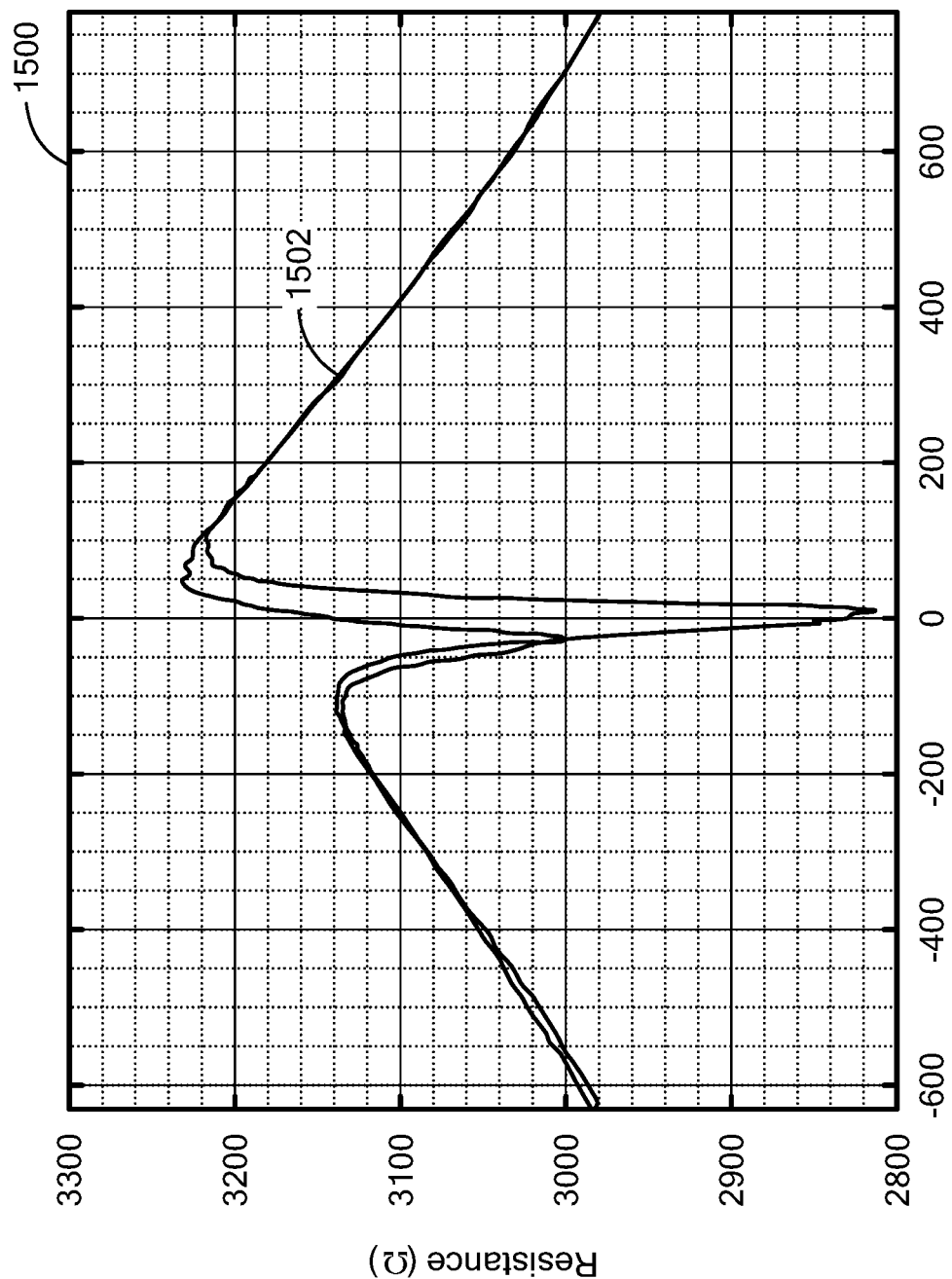
FIG. 15 is a graph of an example of a response of the TMR when a reference direction is perpendicular to the $H_x$-axis as depicted in FIG. 13.

Referring to FIG. 15, a spin flop may produce different curves depending on the orientation of the reference layer. For example, a graph 1500 depicts a curve 1502 of a TMR element that is orientated perpendicular to the horizontal magnetic field axis. Between 150 and 800 Oe, the TMR element exhibits a linear behavior. Thus, an MR bridge of TMR or GMR elements may be constructed for a sensor using unconventional reference directions (i.e. perpendicular to the sensitive direction of the sensor) to achieve a linear sensor that may operate with a magnetic field intensity unusually higher than the upper limit of the linear and saturation ranges of a GMR or TMR element alone.

Figure 16:
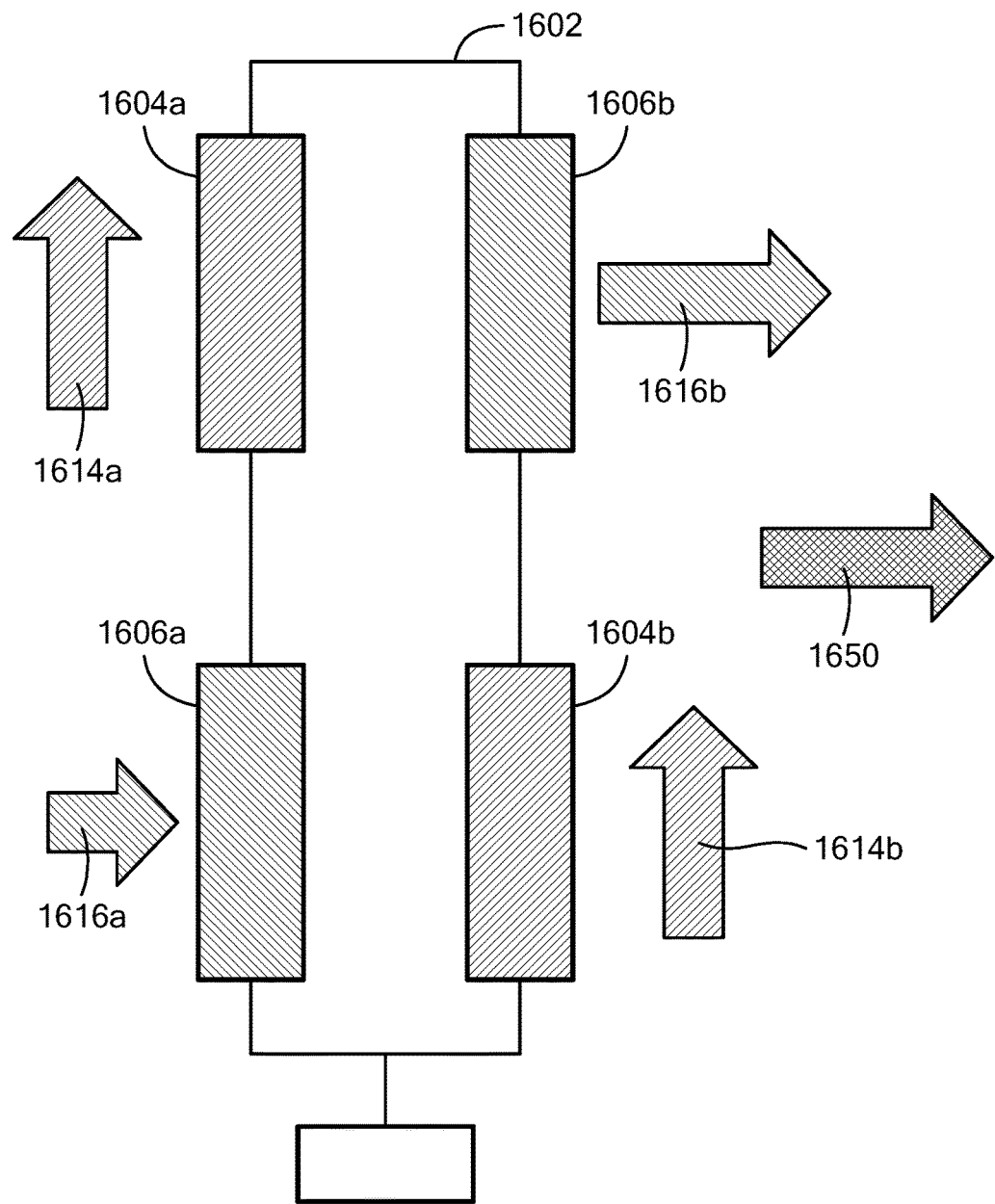
FIG. 16 is a circuit diagram of an example of a linear bridge used to detect the magnetic field trajectory of FIG. 13.

Referring to FIG. 16, an example of a linear bridge that operates in a magnetic field greater than 200 Oe is a linear bridge 1602. In one example, the linear bridge 1602 is a current-driven bridge. The linear bridge 1602 is constructed to detect changes in a magnetic field intensity in a direction 1650, which is the sensitive direction of the linear bridge 1602. In one example, the bridge 1602 may detect a magnetic field trajectory such as the magnetic field trajectory 1302 (FIG. 13).

The bridge 1602 includes an MR element 1604a, an MR element 1604b, an MR element 1606a and an MR element 1606b. Each MR element 1604a, 1604b, 1606a, 1606b includes a reference direction. For example, the MR element 1604a includes a reference direction 1614a, the MR element 1604b includes a reference direction 1614b, the MR element 1606a includes a reference direction 1616a and the MR element 1606b includes a reference direction 1616b.

The MR element 1604a and the MR element 1604b are a type of MR element used that are more sensitive to changes in magnetic field intensity for a high magnetic field intensity (e.g., greater than 200 Oe) along the direction 1650, or sensitivity MR elements. For example, the MR elements 1604a, 1604b as compared to the MR elements 1606a, 1606b are more sensitive to changes in magnetic field intensity in the linear bridge 1602. The MR elements 1604a, 1604b are electrically the same and their reference directions 1614a, 1614b are equal.

In one example, the reference directions 1614a, 1614b are about perpendicular to the direction 1650. In one particular example, the reference directions 1614a, 1614b are between 80° and 130° offset from the direction 1650. In another particular example, the reference directions 1614a, 1614b are between −80° and −130° offset from the direction 1650.

The MR element 1606a and the MR element 1606b are a type of MR element used for compensating for the non-linearity of other MR elements or compensation MR elements. For example, the MR elements 1606a, 1606b are used to compensate for the non-linearity of the MR elements 1604a, 1604b. In one particular example, a number of pillars for the MR elements 1606a, 1606b are selected to set a controlled offset of the bridge output at a desired magnetic field intensity value. The MR elements 1606a, 1606b as compared to the MR elements 1604a, 1604b yield almost no sensitivity to changes in the magnetic field intensity in the linear bridge 1602.

The MR elements 1606a, 1606b are electrically the same and their reference directions 1616a, 1616b are equal. In one example, the reference directions 1616a, 1616b are about parallel to the direction 1650. In one particular example, the reference directions 1616a, 1616b are between −20° and 20° offset from the direction 1650.

Figure 17:
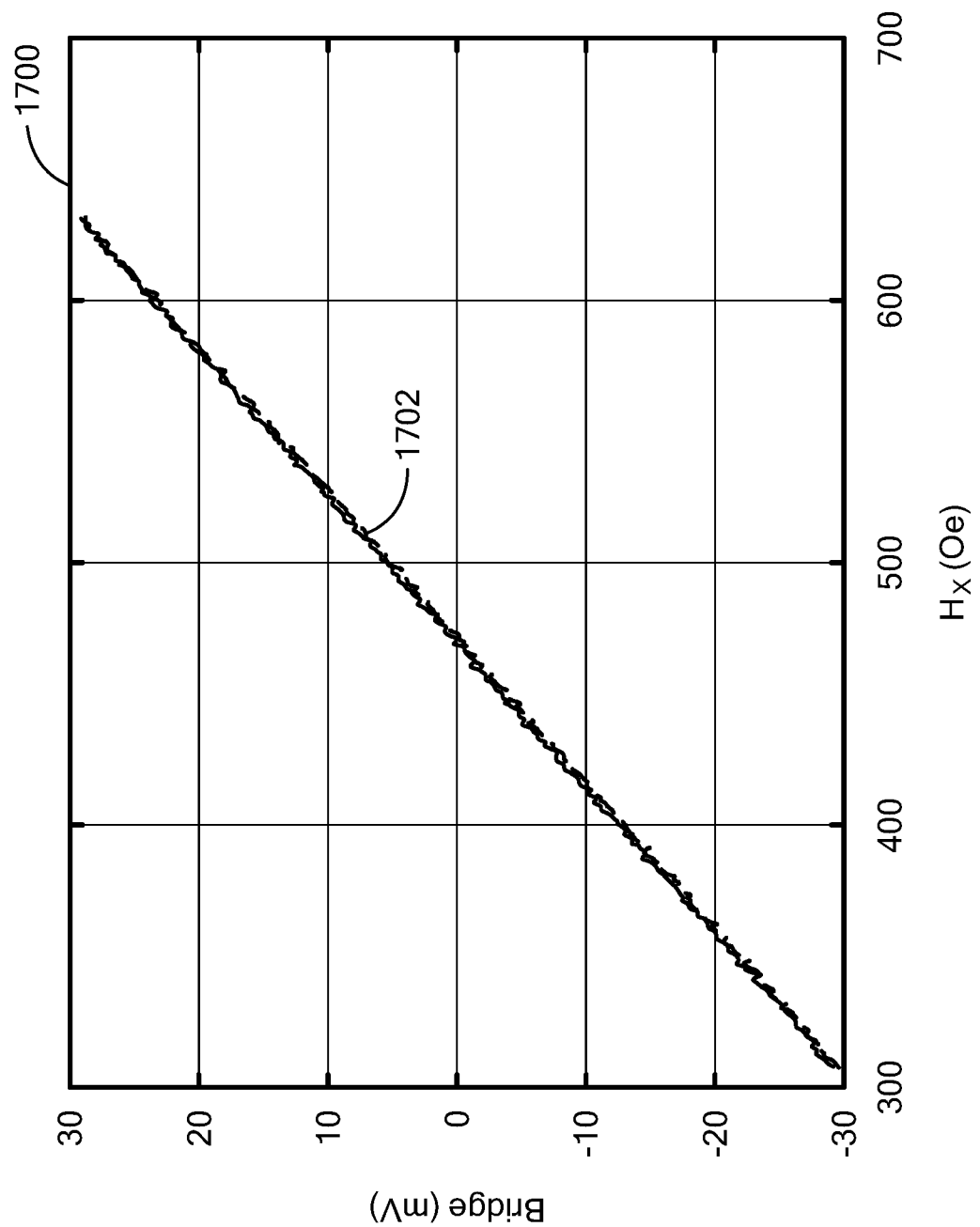
FIG. 17 is a graph of an example of an output of the bridge of FIG. 16.

Referring to FIG. 17, a graph 1700 depicts a curve 1702, which is an example of an output signal of the linear bridge 1602 (FIG. 16). The curve 1702 has a linear range of about 350 Oe (e.g., from about 300 Oe to about 650 Oe) and controlled offset of the output signal of the linear bridge is set to 0 mV at about 470 Oe. The curve 1702 has a 0.7% integral non-linearity (INL) and the sensitivity is about 0.18 mV/Oe for 250 microwatts of power consumption.

Figure 18B:
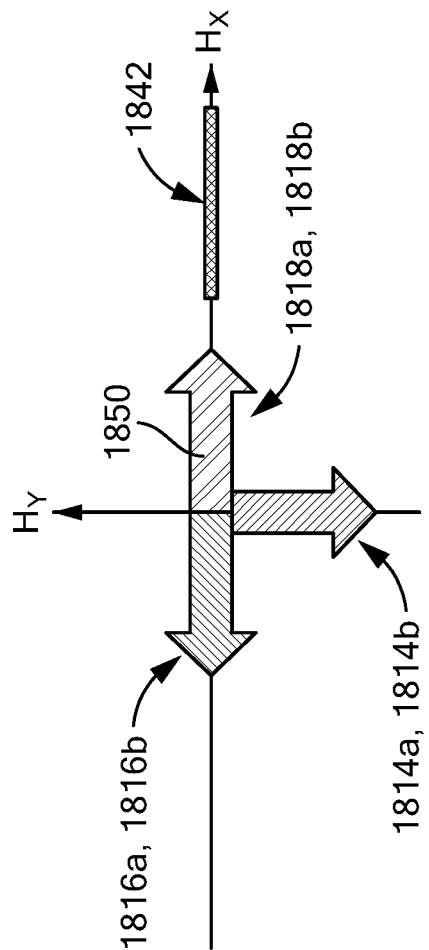
FIG. 18B is a graph of an example of reference directions for the MR elements in the bridge of FIG. 18A.
Figure 18A:
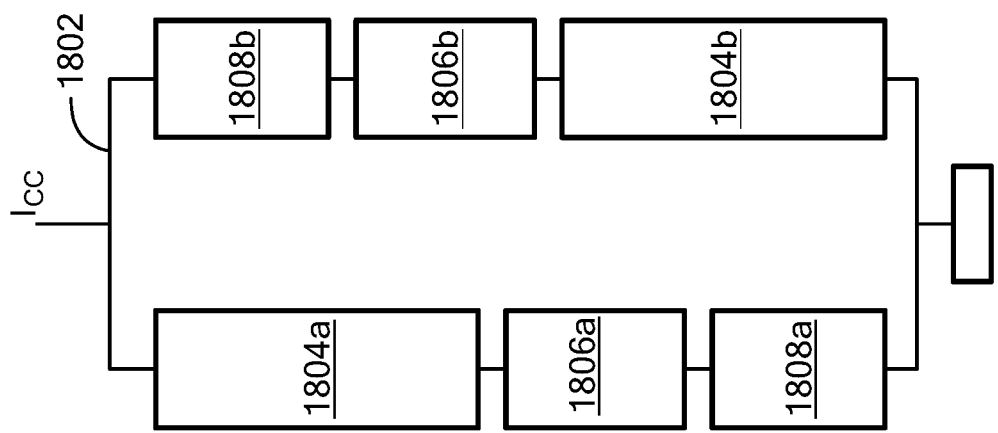
FIG. 18A is a circuit diagram of another example of a linear bridge to detect the magnetic field trajectory in FIG. 13.

Referring to FIGS. 18A and 18B, another example of a linear bridge that operates in a magnetic field intensity that is greater than 200 OE is a linear bridge 1802. The bridge 1802 is similar to the bridge 1602 (FIG. 16), but the MR elements performing the compensation for non-linearity (MR elements 1606a, 1606b in FIG. 16) are each replaced by two MR elements as described herein. In one example, the linear bridge 1802 is a current-driven bridge.

As further described herein, the bridge 1802 may be constructed to have a linear output that is independent of temperature for a certain temperature range (e.g., −10° C. to 100° C.). As will be further described herein, the selection of pillar count for each of the MR elements 1804a, 1804b, 1806a, 1806b, 1808a, 1808b and the selection of the reference directions 1814a, 1814b, 1816a, 1816b, 1818a, 1818b may be used to compensate for temperature. For example, the numbers of pillars and exact reference directions 1814a, 1814b, 1816a, 1816b, 1818a, 1818b of each element 1804a, 1804b, 1806a, 1806b, 1808a, 1808b are selected to not exceed the maximum resistance of the bridge 1802 over temperature and to reduce as much as possible the temperature dependency of the controlled offset and sensitivity, while setting the control offset to zero at the desired magnetic field intensity value.

The linear bridge 1802 is constructed to detect changes in a magnetic field intensity in a direction 1850, which is the sensitive direction of the linear bridge 1802 to detect magnetic field intensity changes in a magnetic field trajectory such as the magnetic field trajectory 1842. Like the magnetic field trajectory 1302 (FIG. 13), the magnetic field trajectory 1842 has nonzero horizontal magnetic field intensity values and zero vertical magnetic field intensity values. In particular, the nonzero horizontal magnetic field intensity values of the magnetic field trajectory 1842 are greater than 200 Oe.

The bridge 1802 includes an MR element 1804a, an MR element 1804b, an MR element 1806a, an MR element 1806b, an MR element 1808a and an MR element 1808b. The MR element 1804a includes a reference direction 1814a, the MR element 1804b includes a reference direction 1814b, the MR element 1806a includes a reference direction 1816a, the MR element 1806b includes a reference direction 1816b, the MR element 1808a includes a reference direction 1818a and the MR element 1808b includes a reference direction 1818b.

The MR element 1804a and the MR element 1804b are sensitivity MR elements similar to MR elements 1604a, 1604b (FIG. 16). The MR elements 1804a, 1804b are electrically the same and their reference directions 1814a, 1814b are equal.

In one example, the reference directions 1814a, 1814b are perpendicular to the sensitive direction 1850 of the linear sensor 1802. In one particular example, the reference directions 1814a, 1814b are between 80° and 130° offset from the direction 1850. In another particular example, the reference directions 1814a, 1814b are between −80° and −130° offset from the direction 1850.

The MR elements 1806a, 1806b and the MR elements 1808a, 1808b are compensation MR elements similar to MR elements 1606a, 1606b (FIG. 16) and are used to compensate for the non-linearity of the MR elements 1804a, 1804b. The MR elements 1806a, 1806b are electrically the same and their reference angles 1816a, 1816b are equal. The MR elements 1808a, 1808b are electrically the same and their reference angles 1818a, 1818b are equal.

The MR elements 1806a, 1806b, 1808a, 1808b as compared to the MR elements 1804a, 1804b yield almost no sensitivity in the linear bridge 1802. The MR elements 1806a, 1806b, 1808a, 1808b are used to compensate for the non-linearity of the MR elements 1804a, 1804b. In one particular example, a number of pillars for the MR elements 1806a, 1806b, 1808a, 1808b are selected to offset the non-linearity of the MR elements 1804a, 1806b.

In one example, the reference directions 1816a, 1816b are about antiparallel to the direction 1850. In one particular example, the reference directions 1816a, 1816b are between 160° and 200° offset from the direction 1850. In one particular example, the reference directions 1816a, 1816b are selected so that the resistance of the MR elements 1806a, 1806 are at their maximum resistance.

In one example, the reference directions 1818a, 1818b are about parallel to the direction 1850. In one particular example, the reference directions 1816a, 1816b are between −20° and 20° offset from the direction 1850. In one particular example, the reference directions 1818a, 1818b are selected so that the resistance of the MR elements 1808a, 1808b are at their minimum resistance.

In one particular example, the number of pillars of the MR elements 1806a, 1806b and the MR elements 1808a, 1808b are selected so that the temperature coefficient of the sum of the MR elements 1806a, 1806b and the MR elements 1808a, 1808b is relatively close to the temperature coefficient of the MR elements 1804a, 1804b. In one example, the number of pillars for each of the MR elements 1804a, 1804b, 1806a, 1806b, 1808a, 1808b is selected along with the reference directions in an optimization process.

Figure 19A:
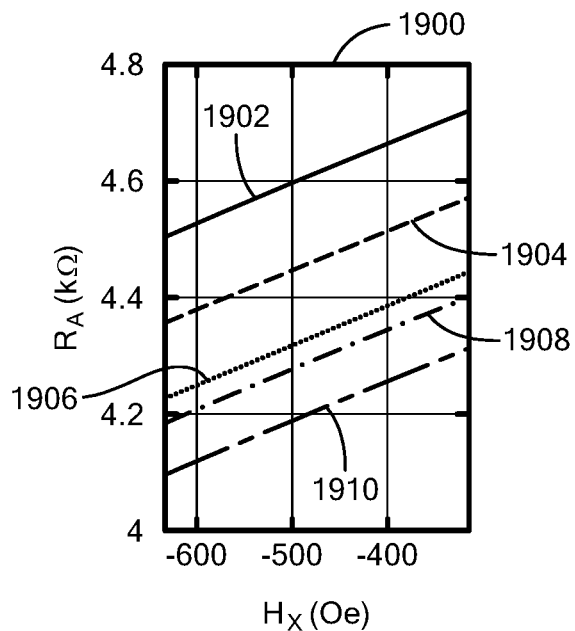
FIGS. 19A, 19B and 19C are graphs of examples of the resistance versus horizontal magnetic field intensity values for different temperatures for the MR elements in the linear bridge of FIG. 18A.

Referring to FIG. 19A, a graph 1900 depicts a resistance $R_A$ of the MR elements 1804a, 1804b versus the horizontal magnetic field intensity for different temperatures. For example, a curve 1902 depicts the resistance $R_A$ versus the horizontal magnetic field intensity at a temperature of −9.5° C. For example, a curve 1904 depicts the resistance $R_A$ versus the horizontal magnetic field intensity at a temperature of 27.5° C. For example, a curve 1906 depicts the resistance $R_A$ versus the horizontal magnetic field intensity at a temperature of 59.0° C. For example, a curve 1908 depicts the resistance $R_A$ versus the horizontal magnetic field intensity at a temperature of 69.7° C. For example, a curve 1910 depicts the resistance $R_A$ versus the horizontal magnetic field intensity at a temperature of 90.7° C.

Figure 19B:
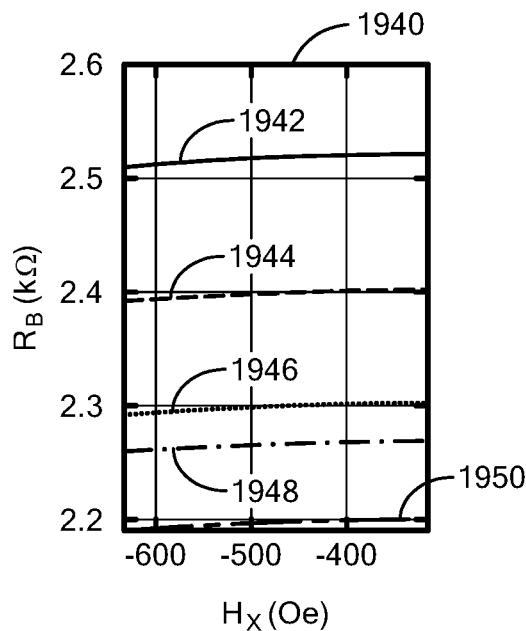

Referring to FIG. 19B, a graph 1940 depicts a resistance $R_B$ of the MR elements 1806a, 1806b versus the horizontal magnetic field intensity for different temperatures. For example, a curve 1942 depicts the resistance $R_B$ versus the horizontal magnetic field intensity at a temperature of −9.5° C. For example, a curve 1944 depicts the resistance $R_B$ versus the horizontal magnetic field intensity at a temperature of 27.5° C. For example, a curve 1946 depicts the resistance $R_B$ versus the horizontal magnetic field intensity at a temperature of 59.0° C. For example, a curve 1948 depicts the resistance $R_B$ versus the horizontal magnetic field intensity of 69.7° C. For example, a curve 1950 depicts the resistance $R_B$ versus the horizontal magnetic field intensity at a temperature of 90.7° C.

Figure 19C:
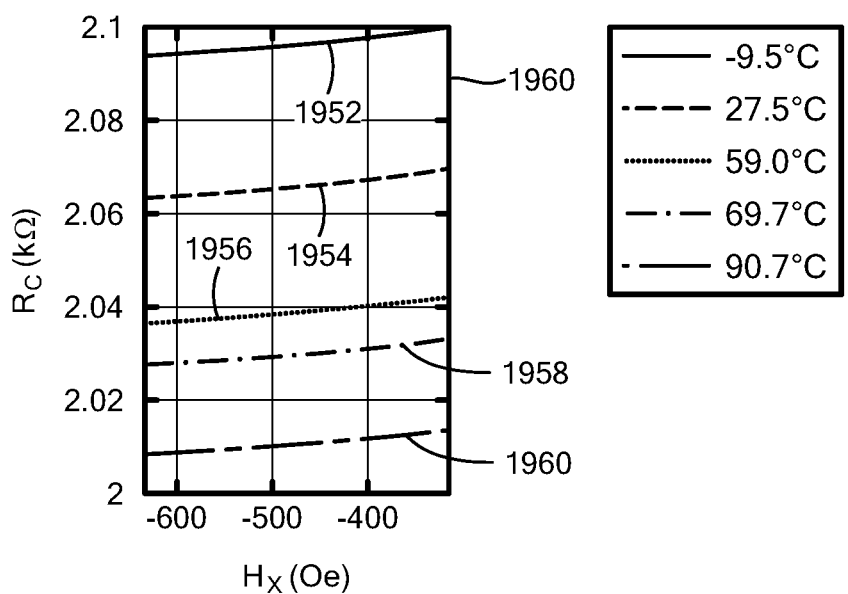

Referring to FIG. 19C, a graph 1960 depicts a resistance $R_C$ of the MR elements 1808a, 1808b versus the horizontal magnetic field intensity for different temperatures. For example, a curve 1952 depicts the resistance $R_C$ versus the horizontal magnetic field intensity at a temperature of −9.5° C. For example, a curve 1954 depicts the resistance $R_C$ versus the horizontal magnetic field intensity at a temperature of 27.5° C. For example, a curve 1956 depicts the resistance $R_C$ versus the horizontal magnetic field intensity at a temperature of 59.0° C. For example, a curve 1958 depicts the resistance $R_C$ versus the horizontal magnetic field intensity at a temperature of 69.7° C. For example, a curve 1960 depicts the resistance $R_C$ versus the horizontal magnetic field intensity at a temperature of 90.7° C.

Figure 20:
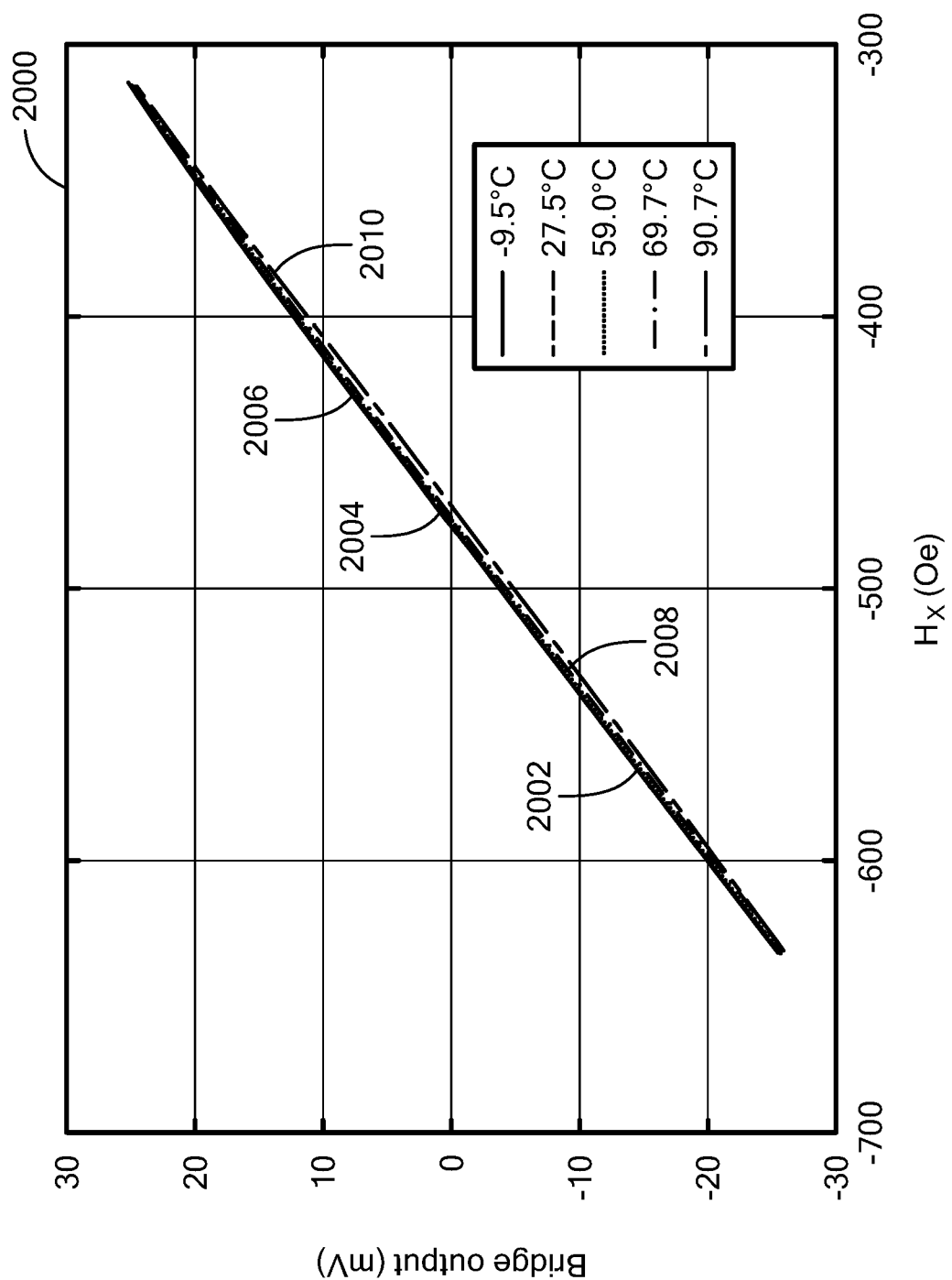
FIG. 20 is a graph of examples outputs of the linear bridge in FIG. 18A for various temperatures.

Referring to FIG. 20, a graph 2000 depicts an output of a linear bridge (e.g., the linear bridge 1802 (FIG. 18A)) versus a horizontal magnetic field intensity values for different temperatures used in FIGS. 19A to 19C. As shown in FIG. 20, the selection of the pillar count and reference directions 1814a, 1814b, 1816a, 1816b, 1818a, 1818b for the MR elements 1804a, 1804b, 1806a, 1806b, 1808a, 1808b enable the output of the linear bridge to be independent of temperature between −10° C. and 100° C.

For example, a curve 2002 depicts the bridge output versus the horizontal magnetic field intensity at a temperature of −9.5° C. For example, a curve 2004 depicts the bridge output versus the horizontal magnetic field intensity at a temperature of 27.5° C. For example, a curve 2006 depicts the bridge output versus the horizontal magnetic field intensity of 59.0° C. For example, a curve 2008 depicts the bridge output versus the horizontal magnetic field intensity at a temperature of 69.7° C. For example, a curve 2010 depicts the bridge output versus the horizontal magnetic field intensity at a temperature of 90.7° C.

Figures 21, 22:
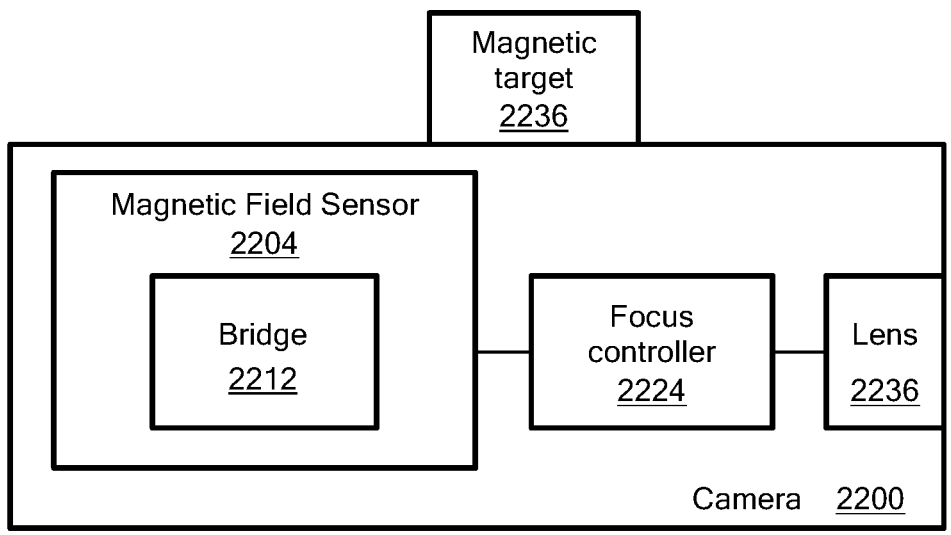
FIG. 21 is a table of an example of pillar counts and reference directions used to achieve the graph in FIG. 20.
FIG. 22 is a block diagram of an example of camera that includes a bridge that includes MR elements.

Referring to FIG. 21, a table 2100 depicts the pillar count and reference angles selected for the MR elements 1804a, 1804b, 1806a, 1806a, 1808a, 1808a to achieve the linear curves 2002, 2004, 2006, 2008, 2010 in FIG. 20. For example, the MR elements 1804a, 1804b have a pillar count of 17.5 each and the reference angles 1814a, 1814b are −112.75° each; the MR elements 1806a, 1806b have a pillar count of 6 each and the reference angles 1816a, 1816b are 175° each; and the MR elements 1808a, 1808b have a pillar count of 12.5 each and the reference angles 1818a, 1816b are −8°.

Referring to FIG. 22, the linear bridges described herein (e.g., the bridge 402, the bridge 1002, the bridge 1602, the bridge 1802) may be used in a camera. In one example, the camera may be used in mobile phone. The camera 2200 includes a magnetic-field sensor 2204, a focus controller 2224, a lens 2236 and a magnetic target 2236.

The magnetic-field sensor 2204 includes a bridge 2212. In one example, the bridge 2212 is similar to the bridge 402. In another example, the bridge 2212 is similar to the bridge 1002. In a further example, the bridge 2212 is similar to the bridge 1602. In a still further example, the bridge 2212 is similar to the bridge 1902.

In one example, the magnetic target 2236 may be moved and detected by the magnetic field sensor 2204 to provide an output to the focus controller 2224 to change the focal length of the lens 2236.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A bridge comprising:
    a first magnetoresistance element having a first reference angle;
    a second magnetoresistance element in series with the first magnetoresistance element and having a second reference angle;
    a third magnetoresistance element in parallel with the first magnetoresistance element and having the first reference angle; and
    a fourth magnetoresistance element in series with the third magnetoresistance element and having the second reference angle,
    wherein an output of the bridge has a linear response over a range of horizontal magnetic field values having non-zero values,
    wherein the range of horizontal magnetic field intensity values are associated with vertical magnetic field intensity values having zero Oersted (Oe) values,
    wherein a reference angle indicates an angle the magnetoresistance element is most sensitive to changes in a magnetic field.

2. The bridge of claim 1, wherein the first, second, third and fourth magnetoresistance elements are each a giant magnetoresistance (GMR) element or a tunnel magnetoresistance (TMR) element.

3. The bridge of claim 1, further comprising:
    a fifth magnetoresistance element in series with the first magnetoresistance element and having a third reference angle; and
    a sixth magnetoresistance element in series with the third magnetoresistance element and having the third reference angle.

4. The bridge of claim 3, wherein the fifth magnetoresistance element and the sixth magnetoresistance element are constructed to be the same.

5. The bridge of claim 4, wherein the fifth magnetoresistance element and the sixth magnetoresistance element are constructed with the same pillar count.

6. The bridge of claim 5, wherein the pillar count of each of the first, second, third, fourth, fifth and sixth magnetoresistance elements and the first, second and third reference angles are selected to enable the bridge to generate a linear output with a controlled offset over a temperature range from −10° C. to 100° C.

7. The bridge of claim 1, wherein the first reference angle and the second reference angle enable the output of the bridge to have the linear response over the range of horizontal magnetic field intensity values having non-zero values.

8. The bridge of claim 7, wherein the first reference angle and the second reference angle enable the output of the bridge to have the linear response over the range of horizontal magnetic field intensity values none of which have zero values.

9. The bridge of claim 1, wherein the first magnetoresistance element and the third magnetoresistance element are constructed to be the same.

10. The bridge of claim 9, wherein the first magnetoresistance element and the third magnetoresistance element are constructed with the same pillar count.

11. The bridge of claim 10, wherein the second magnetoresistance element and the fourth magnetoresistance element are constructed to be the same.

12. The bridge of claim 11, wherein the second magnetoresistance element and the fourth magnetoresistance element are constructed with the same pillar count.

13. The bridge of claim 1, wherein the linear response is over a range that includes horizontal magnetic field values no less than 200 Oe.

14. The bridge of claim 13, wherein the linear response is over a range that includes horizontal magnetic field values no less than 300 Oe.

15. The bridge of claim 13, wherein the bridge has the linear response over a temperature range from −10° C. to 100° C.

16. The bridge of claim 1, wherein the first reference angle is about perpendicular to the second reference angle.

17. The bridge of claim 16, wherein the first reference angle is about perpendicular to a magnetic field for the sensor to sense.

18. A camera, comprising:
a magnetic field sensor comprising a bridge, the bridge comprising:
- a first magnetoresistance element having a first reference angle;
- a second magnetoresistance element in series with the first magnetoresistance element and having a second reference angle;
- a third magnetoresistance element in parallel with the first magnetoresistance element and having the first reference angle; and
- a fourth magnetoresistance element in series with the third magnetoresistance element and having the second reference angle,
- wherein an output of the bridge has a linear response over a range of horizontal magnetic field intensity values having non-zero values,
- wherein the range of horizontal magnetic field intensity values are associated with vertical magnetic field intensity values having zero Oersted (Oe) values,
- wherein a reference angle indicates an angle the magnetoresistance element is most sensitive to changes in a magnetic field.

19. The camera of claim 18, wherein the camera is disposed in a cellular device.

20. The camera of claim 18, further comprising:
a magnetic target;
a focus controller;
a lens;
wherein a movement of the magnetic target is detected by the magnetic field sensor to provide an output to the focus controller to change the focal length of the lens.

* * * * *

UNITED STATES PATENT AND TRADEMARK OFFICE
CERTIFICATE OF CORRECTION

PATENT NO. : 11,408,948 B2
APPLICATION NO. : 16/921191
DATED : August 9, 2022
INVENTOR(S) : Rémy Lassalle-Balier Page 1 of 1

It is certified that error appears in the above-identified patent and that said Letters Patent is hereby corrected as shown below:

In the Specification

Column 3, Line 19 delete "examples" and replace with --example--.

Column 3, Line 24 delete "of camera" and replace with --of a camera--.

Column 5, Line 35 delete "tiled" and replace with --tilted--.

Column 5, Line 35 delete "associate" and replace with --associated--.

Column 6, Line 34 delete "Process 1000" and replace with --Process 1100--.

Column 6, Lines 48-49 delete "MR 908a, 908b elements," and replace with --MR elements 908a, 908b--.

Column 7, Line 47 delete "are is not" and replace with --are not--.

Column 10, Line 26 delete ", 1806b." and replace with --, 1804b.--.

Column 10, Line 33 delete "1806" and replace with --1806b--.

Column 11, Line 47 delete ", 1806a, 1806a, 1808a, 1808a to" and replace with --, 1806a, 1806b, 1808a, 1808b to--.

Column 11, Line 59 delete "in mobile" and replace with --in a mobile--.

Column 11, Line 67 delete "1902." and replace with --1802.--.

Signed and Sealed this
Thirty-first Day of October, 2023

Katherine Kelly Vidal
*Director of the United States Patent and Trademark Office*